(12) United States Patent
Nishimura et al.

(10) Patent No.: US 7,501,917 B2
(45) Date of Patent: Mar. 10, 2009

(54) SURFACE ACOUSTIC WAVE FILTER

(75) Inventors: Kazunori Nishimura, Kyoto (JP); Tsutomu Igaki, Hyogo (JP); Ken Matsunami, Osaka (JP); Hiroyuki Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 338 days.

(21) Appl. No.: 10/577,141

(22) PCT Filed: Nov. 18, 2004

(86) PCT No.: PCT/JP2004/017527

§ 371 (c)(1),
(2), (4) Date: Apr. 25, 2006

(87) PCT Pub. No.: WO2005/050837

PCT Pub. Date: Jun. 2, 2005

(65) Prior Publication Data

US 2007/0069837 A1    Mar. 29, 2007

(30) Foreign Application Priority Data

Nov. 21, 2003    (JP) .............................. 2003-392224

(51) Int. Cl.
*H03H 9/64*    (2006.01)
*H03H 9/145*    (2006.01)
(52) U.S. Cl. ...................................... 333/195; 333/196
(58) Field of Classification Search .................. 333/193, 333/195

See application file for complete search history.

(56) References Cited

U.S. PATENT DOCUMENTS

| 5,682,126 | A  | * | 10/1997 | Plesski et al. | ................ 333/193 |
| 6,420,946 | B1 | * | 7/2002  | Bauer et al.   | ................ 333/193 |
| 7,304,553 | B2 | * | 12/2007 | Bauer et al.   | ................ 333/193 |
| 2003/0117240 | A1 | * | 6/2003 | Inoue et al.  | ................ 333/195 |
| 2005/0212620 | A1 | * | 9/2005 | Bauer et al.  | ................ 333/193 |

FOREIGN PATENT DOCUMENTS

| JP | 8-242140    | 9/1996 |
| JP | 9-232908    | 9/1997 |
| JP | 9-246911    | 9/1997 |
| JP | 9-270663    | 10/1997 |
| JP | 10-242799   | 9/1998 |
| JP | 11-088112   | 3/1999 |
| JP | 11-163664   | 6/1999 |
| JP | 2000-201052 | 7/2000 |
| JP | 2001-358555 | 12/2001 |
| JP | 2003-198317 | 7/2003 |
| WO | WO 03/081773 | * 10/2003 |

* cited by examiner

*Primary Examiner*—Barbara Summons
(74) *Attorney, Agent, or Firm*—Wenderoth, Lind & Ponack, L.L.P.

(57) ABSTRACT

A SAW filter is configured by forming a first IDT and a second IDT on a piezoelectric substrate, and the first IDT is arranged between one terminal of input/output terminals and another terminal of the input/output terminals, i.e., serially in a signal path, and the second IDT is arranged in parallel to a signal path from a portion between one terminal of the input/output terminals and the first IDT. The first IDT and the second IDT are arranged in proximity to each other and on the same propagation path of surface acoustic waves which are excited by each of the resonators.

19 Claims, 18 Drawing Sheets

PRIOR ART    FIG. 21
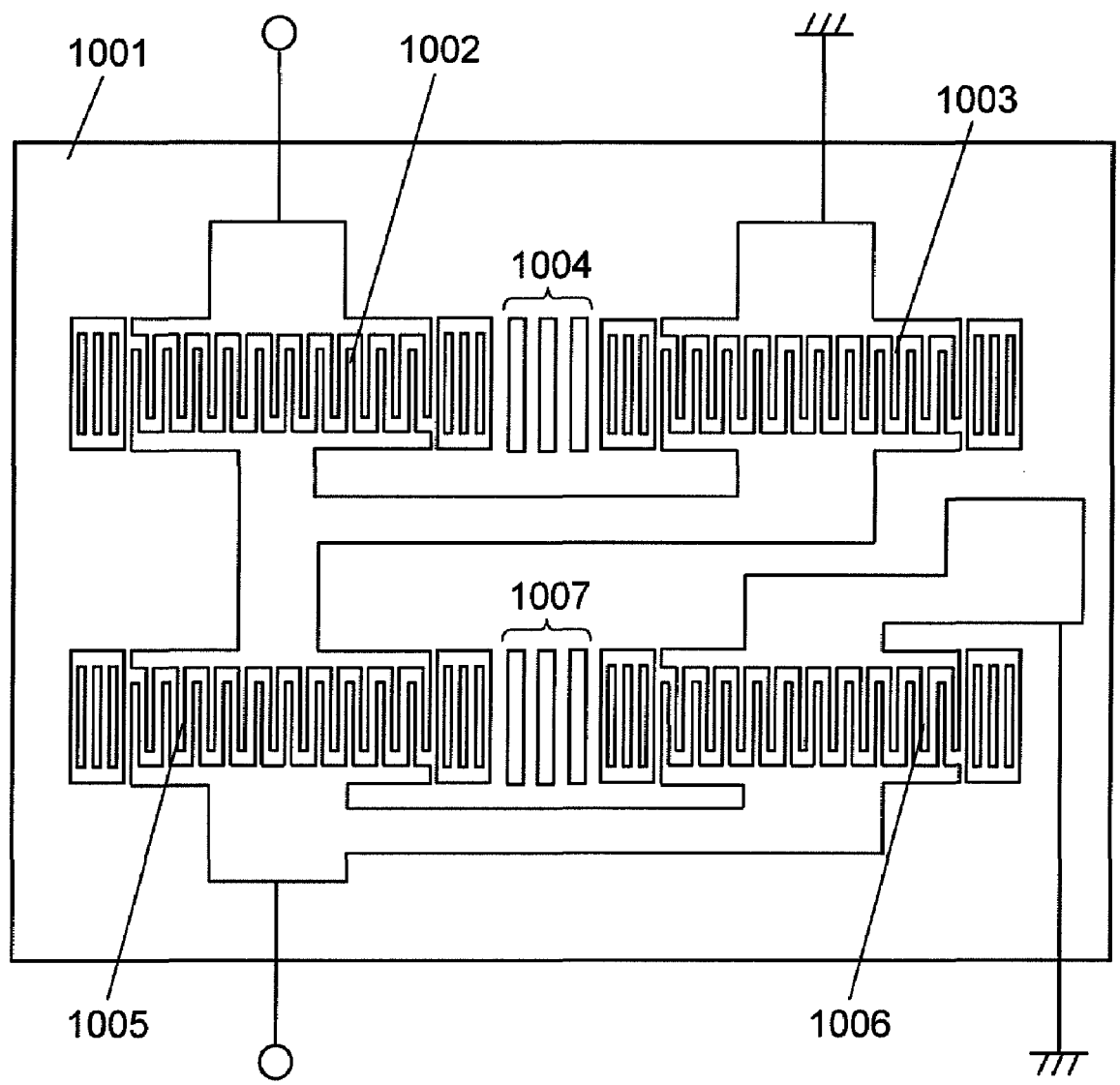

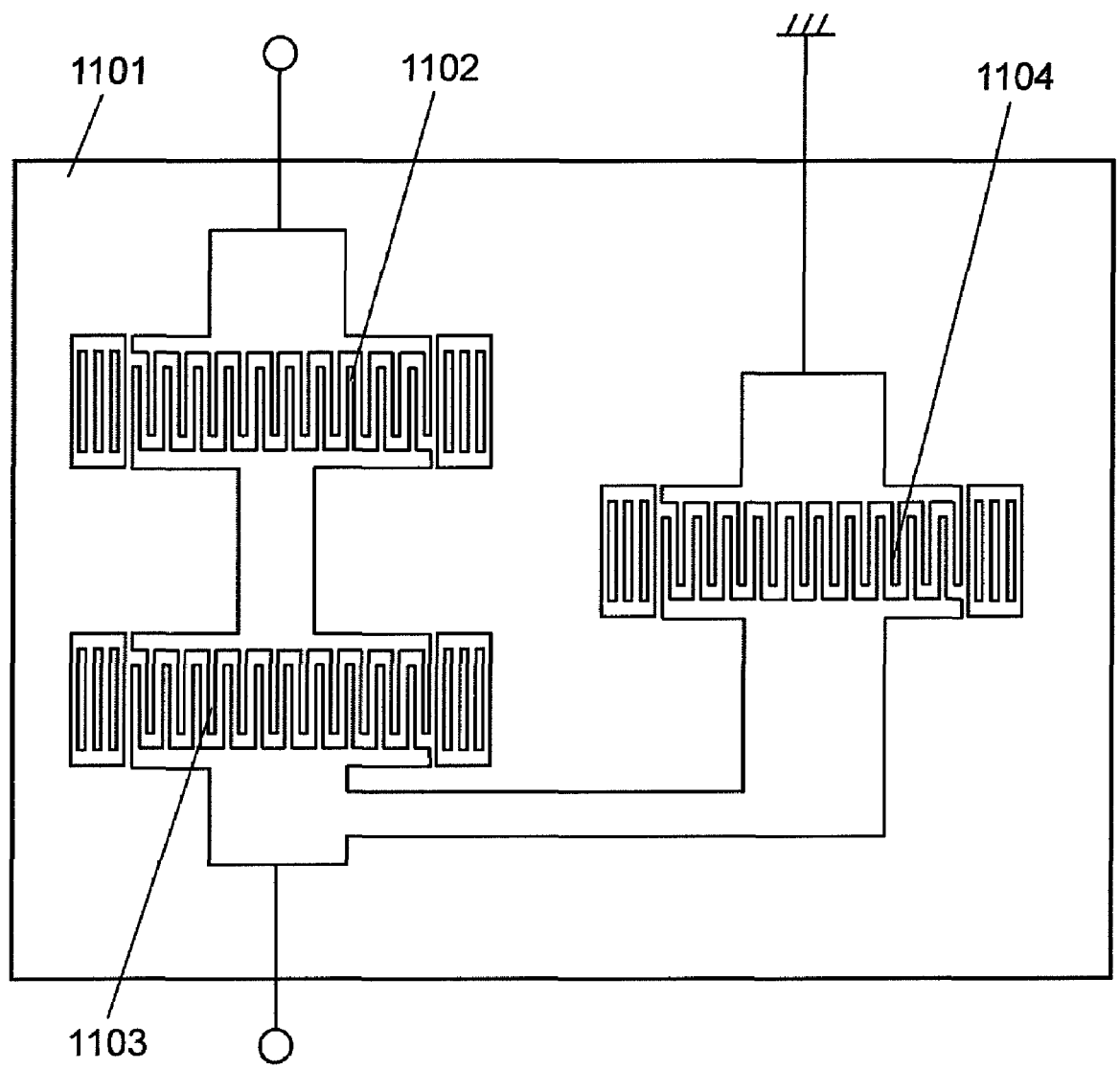
PRIOR ART    FIG. 22

SURFACE ACOUSTIC WAVE FILTER

BACKGROUND OF THE INVENTION

1. Technical Field

This invention relates to a surface acoustic wave filter which is used for a communication device, etc., such as a portable telephone.

2. Background Art

In recent years, along with development of mobile communications, realization of high performance and miniaturization of devices to be used have been desired. As a filter for a mobile communication device among those devices, conventionally, a surface acoustic wave filter (hereinafter, called a SAW filter) has been used widely. At the present day, as a SAW filter for an RF (Radio Frequency) stage, a longitudinal mode type and a ladder mode type are mainly used. In particular, as to the ladder type SAW filter, it is possible to realize a low loss as compared with the longitudinal mode SAW filter. The ladder type SAW filter is of such a configuration that a plurality of surface acoustic wave resonators (hereinafter, called SAW resonators) are connected in a ladder mode, and configured by SAW resonators operating as a serial arm and SAW resonators operating as a parallel arm.

As prior art relating to the ladder-type SAW filter, JP-A-9-270663 publication discloses a method of arranging SAW resonators operating as a serial arm and SAW resonators operating as a parallel arm, and separating them by a certain distance. FIG. 20 is a block diagram of a SAW filter configured in this manner and disclosed in the above-mentioned first prior art document. This SAW filter is configured by SAW resonators 902 as a serial arm, SAW resonators 903 as a parallel arm which are formed on piezoelectric substrate 901 and signal lines 904 connected to these SAW resonators 902, 903. These SAW resonators 902, 903 are arranged in such a manner that respective overlap lengths of comb-shaped electrodes configuring these SAW resonators 902, 903 overlap in a propagation direction of leaking surface acoustic wave. In this case, if it is set up in such a manner that a distance of a gap between SAW resonator 902 as the serial arm and SAW resonator 903 as the parallel arm becomes 10 times wavelength of the leaking surface acoustic wave, or more, it is possible to prevent the interference of a leaking surface acoustic wave in these SAW resonators 902, 903.

As another prior art relating to the ladder type SAW filter, JP-A-9-232908 publication discloses a method of arranging a slit plate between SAW resonators operating as a serial arm and SAW resonators operating as a parallel arm. FIG. 21 is a block diagram of a SAW filter of the above-mentioned second prior art document, which was configured in this manner. This SAW filter is configured by SAW resonators 1002, 1005 of a serial arm, SAW resonators 1003, 1006 of a parallel arm and slit plates 1004, 1007, which are formed on piezoelectric substrate 1001. Slit plate 1004 is disposed between SAW resonator 1002 of the serial arm and SAW resonator 1003 of the parallel arm, to block off surface acoustic waves leaking from respective SAW resonators 1002, 1003. In the same manner, slit plate 1007 is disposed between SAW resonator 1005 of the serial arm and SAW resonator 1006 of the parallel arm, to block off surface acoustic waves leaking from respective SAW resonators 1005, 1006.

As another prior art relating to the ladder type SAW filter, JP-A-2000-201052 publication discloses a method of arranging in such a manner that propagation paths of surface acoustic wave in SAW resonators operating as a serial arm and SAW resonators operating as a parallel arm do not overlap. FIG. 22 is a block diagram of a SAW filter of the above-mentioned third prior art document, which was configured in this manner. This SAW filter is configured by SAW resonators 1102, 1103 of a serial arm, and SAW resonator 1004 of a parallel arm, which are formed on piezoelectric substrate 1101. In this configuration, the filter is formed in such a manner that a surface acoustic wave propagation path of SAW resonator 1104 of the parallel arm, which is sandwiched by two SAW resonators 1102, 1103 of the serial arm, is located between surface acoustic wave propagation paths of these SAW resonators 1102, 1103 of the serial arm. By this means, surface acoustic waves of respective SAW resonators of the serial arm and the parallel arm do not interfere with each other, and a good filter characteristic is obtained.

However, in the above-mentioned conventional disclosure examples, SAW resonators of a serial arm and SAW resonators of a parallel arm are arranged in an isolated manner by a certain distance. On this account, there is a problem that a size of a SAW filter becomes large. These SAW filters disclose a technique of eliminating an interference of surface acoustic surface waves of SAW resonators of a serial arm and SAW resonators of a parallel arm, but do not disclose a way for utilizing this at all.

The present invention aims to provide a SAW filter which is of a small size and enables low loss; by a SAW filter with a new configuration such that a plurality of SAW resonators are arranged in proximity to each other on the same propagation path, while avoiding the above-mentioned problem.

BRIEF SUMMARY OF THE INVENTION

In order to accomplish the above-mentioned object, a SAW filter of the present invention is comprised of a piezoelectric substrate, and at least two inter-digital transducers (hereinafter, called as IDTs) disposed in proximity to each other on the same surface acoustic wave propagation path on this piezoelectric substrate, and at least one of the IDTs is a first IDT connected serially to a signal path and at least one is a second IDT connected between the signal path and aground, and the first IDT and the second IDT are different in resonance frequency, and the first IDT and the second IDT are formed such a configuration that the electrode fingers of the comb-shaped electrodes of the IDTs are arranged almost continuously.

With to this configuration, it is possible to obtain a SAW filter of a small size and having low loss, as well as having an attenuation characteristic equivalent to that of a so-called L-type configuration of a ladder mode surface acoustic wave filter which is used conventionally. A configuration wherein electrode fingers are arranged almost continuously means that they are arranged in such a manner that a difference of a gap between adjacent electrode fingers falls in an error of approximately 5% or less. By arranging the filter in this manner, it is possible to prevent occurrence of loss due to bulk wave conversion at a boundary between One IDT and another IDT. Alternately, when arranging a strip line electrode between IDTs as described later, it is possible to prevent occurrence of loss due to bulk wave conversion at a boundary between IDT and the strip line electrode. It is also possible to utilize a second IDT from a view point of a first IDT, or the first IDT from a view point of the second IDT, as a reflector.

In the above-mentioned configuration, it is all right even if the first IDT and the second IDT are arranged in such a manner that respective surface acoustic waves are not negated each other. In this case, it is also all right even if the first IDT and the second IDT are configured to be turned into reversed phases of each other.

According to this configuration, it is possible to realize such a configuration that mutual surface acoustic waves are not denied, and therefore, it is possible to realize a SAW filter of a small size and small loss, by disposing a plurality of IDTs with different resonance frequencies in a propagation direction of surface acoustic waves.

In the above-mentioned configuration, it is all right even if the filter is configured in such a manner that resonance frequencies of the first IDT and the second IDT are set up to frequencies necessary for obtaining a preset filter characteristic. In that case, it is all right even if the resonance frequency of the first IDT is roughly matched with the anti-resonance frequency of the second IDT. By this configuration, it is possible to easily obtain a targeted filter characteristic.

In the above-mentioned configuration, it is all right even if a reflector electrode is disposed at the outermost side of IDT including the first IDT and the second IDT. According to this configuration, it is possible to effectively close surface acoustic waves in an IDT, and therefore, it is possible to realize a SAW filter which loss is much more reduced.

In the above-mentioned configuration, it is all right even if a strip line electrode is disposed between the first IDT and the second IDT, and electrode fingers of the comb-shaped electrodes comprised in the first IDT and the second IDT and electrode fingers comprised in the strip line electrode are arranged almost continuously. In this case, it is also all right even if a pitch of electrode fingers of this strip line electrode is set up between a pitch of electrode fingers of the first IDT and a pitch of electrode fingers of the second IDT. According to this configuration, it is possible to effectively close over surface acoustic waves which are excited from respective IDTs in IDTs, and therefore, it is possible to reduce loss.

In the above-mentioned configuration, it is all right even if it is configured in such a manner that a pitch of electrode fingers that are arranged in a boundary area of the first IDT and the second IDT is different from a pitch of electrode fingers which are arranged in respective center areas. In this case, it is also all right even if a weighting method is applied to at least one of IDTs which configure a SAW filter. As this weighting method, apodized weighting, or withdrawal weighting, may be applied.

According to this configuration, it is possible to easily realize a SAW filter by which an attenuation is large and loss is small, by adjusting an attenuation and loss in accordance with the design, in a necessitated frequency domain.

In the above-mentioned configuration, it is all right even if the IDT is configured so as to include a dummy electrode. By arranging and optimizing dummy electrodes, it is possible to realize a SAW filter with much lower loss.

In the above-mentioned configuration, it is all right even if it is configured in such a manner that a third IDT, which is connected between a signal path and a ground, is arranged in proximity to the first IDT, on a side of the first IDT opposite to the second IDT. In this case, it is all right even if a resonance frequency of the third IDT is different from a resonance frequency of the first IDT.

In the above-mentioned configuration, it is all right even if a fourth IDT, which is connected serially to a signal path, is arranged in proximity to the second IDT, on a side of the second IDT opposite to the first IDT. In this case, it is all right even if a resonance frequency of the fourth IDT is different from a resonance frequency of the second IDT.

A SAW filter of the present invention is formed by a configuration wherein a SAW filter with the above-mentioned configuration is used as a SAW element, and these SAW elements are connected in multiple stages. According to this configuration, it is possible to easily obtain a SAW filter having a targeted characteristic, and it is also possible to increase a freedom of design.

According to the present invention, by arranging a plurality of SAW resonators in proximity to each other along the same propagation path, it is possible to realize a small size shape even in the case of a SAW filter in which a high attenuation characteristic is demanded and a lot of resonators are required. In the case that these SAW filters are connected in multiple stages as one element, it is possible to simplify the wiring pattern, and therefore, it is possible to reduce the electrical resistance of the wiring pattern, and it is also possible to realize a SAW filter which loss is reduced.

BRIEF DESCRIPTION OF THE DRAWINGS

FIG. 21 is a block diagram of a conventional SAW filter disclosed in a second prior art document.

FIG. 22 is a block diagram of a conventional SAW filter disclosed in a third prior art document.

DETAILED DESCRIPTION OF THE INVENTION

Figure 1:
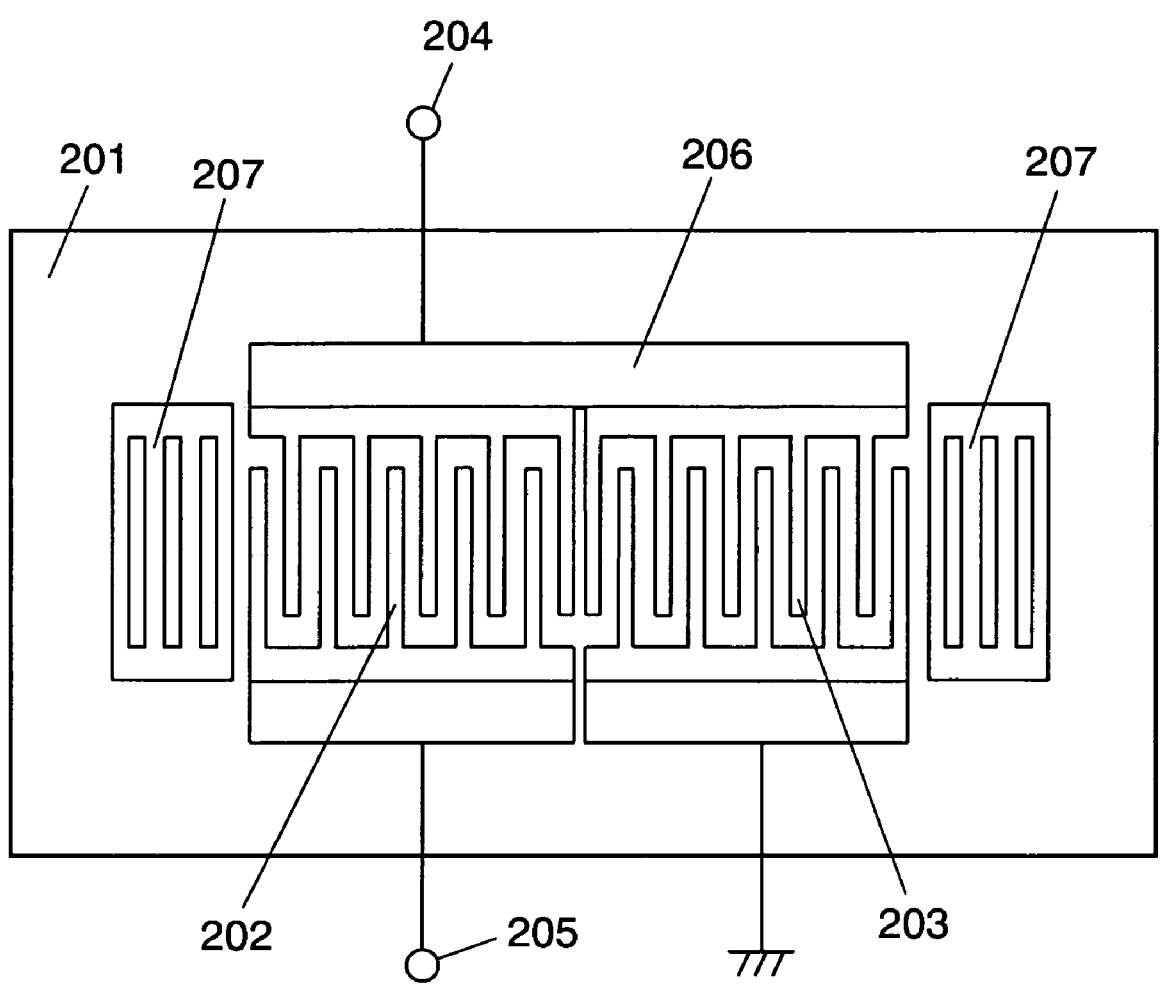
FIG. 1 is a plan view showing a configuration of a SAW filter which relates to a first embodiment of the present invention.

Hereinafter, embodiments of the present invention will be explained in detail with use of the drawings. Since the same reference numerals and signs are given to the same elements, repetitions explanations will be omitted. Drawings shown are schematic, and the number of electrode fingers and a pitch are not described accurately.

FIRST EMBODIMENT

FIG. 1 is a plan view showing a configuration of a SAW filter which relates to a first embodiment. In general, a SAW filter is packaged by ceramic, resin, etc., and used, but FIG. 1 shows only a configuration on a piezoelectric substrate 201. As shown in FIG. 1, a SAW filter of this embodiment is composed of a configuration in which first IDT 202 and second IDT 203 are arranged on a surface of piezoelectric substrate 201, which is formed of lithium tantalate (LiTaO$_3$) of 39° Y-cut X propagation, in such a manner that they are on the same propagation path, and reflector electrodes 207 are disposed on respective end portions.

First IDT 202 is arranged between one terminal 204 and the other terminal 205 of input/output terminals, i.e., serially to a signal path, and can carry out an operation which is equivalent to that of SAW resonators of a serial arm. Second IDT 203 is arranged in parallel to the signal path from a portion between one terminal 204 of the input/output terminals and first IDT 202. This second IDT 203 is connected to one terminal 204 and the first IDT by wiring electrode 206. By such an arrangement and connection configuration, second IDT 203 can carry out an operation which is equivalent to that of SAW resonators of a parallel arm.

As to first IDT 202 and second IDT 203, electrode fingers of the comb-shaped electrodes, comprised in respective IDTs, and are arranged almost continuously, on the same propagation path of surface acoustic waves which are excited by individual SAW resonators. In this example, first IDT 202 and second IDT 203 are configured in such a manner that surface acoustic waves, which are excited by respective SAW resonators, are not negated by each other. Reflector electrodes 207 are arranged on an opposite side to an adjacent side of first IDT 202 and second IDT 203. The SAW filter of the first embodiment is formed by adopting such a configuration.

Wiring electrode 206 and terminal 204 and a terminal of the comb-shaped electrode comprised in first IDT 202 and terminal 205, are connected by a wire lead, etc. The other of the comb-shaped electrodes, comprised in second IDT 203, is connected to an earth terminal by a wire lead, etc., in a similar the same manner, and is grounded.

An electrode finger pitch of the comb-shaped electrode comprised in first IDT 202 is smaller than an electrode finger pitch of the comb-shaped electrode comprised in second IDT 203, and respective pitches are set up so as to realize a filter characteristic based on a design value. An electrode finger pitch of reflector electrode 207 is set up so as to become an intermediate value between an electrode finger pitch of first IDT 202 and an electrode finger pitch of second IDT 203.

By arranging first IDT 202 and second IDT 203 in proximity to each other so as to dispose them on one propagation path, as compared to individual SAW resonators, it becomes equivalent to a filter with a longer resonator length e, and it is possible to improve a SAW resonator characteristic. In consequence, as a SAW filter, it is possible to obtain a band-pass type and small loss characteristic. To the degree that it is possible to arrange first IDT 202 and second IDT 203 in proximity to each other and to shorten a wiring electrode, miniaturization of a SAW filter can be realized. The above-described configuration also becomes a basic configuration unit of an L type SAW filter.

As described above, a SAW filter of the present invention can realize a small size and small loss filter characteristic, by arranging a plurality of SAW resonators in proximity to each other on the same propagation path.

As a method of changing resonance frequencies of first IDT 202 and second IDT 203, there is changing a width of electrode fingers, changing a pitch of electrode fingers, and so on. However, judging from a view, point that it is possible to increase freedom of design of a SAW filter and ease of a process, the method of changing an electrode finger pitch is desirable.

Generally speaking, when of configuring SAW resonators, respective pitches are determined in such a manner that peak frequency of an IDT characteristic is matched with center frequency of a reflection characteristic of a reflector electrode. However, since the reflection characteristic is flat in a relatively wide frequency area, a resonance characteristic is obtained if it is in this flat area, without being accompanied with large deterioration of a characteristic. Therefore, it is all right if a reflection characteristic falls in a flat area in peak frequency of all IDT characteristics, and it is desirable to make a pitch of reflector electrodes larger than a pitch of IDTs having a minimum pitch, and smaller than a pitch of IDTs having a maximum pitch. By arranging IDTs in such a manner that respective surface acoustic waves are not negated, it is possible to avoid mutual interference.

In a case of arranging first IDT 202 and second IDT 203 in such a manner that surface acoustic waves are not negated, it is desirable to configure the filter in such a manner that first IDT 202 and second IDT 203 have reversed phases with respect to each other.

Figure 2:
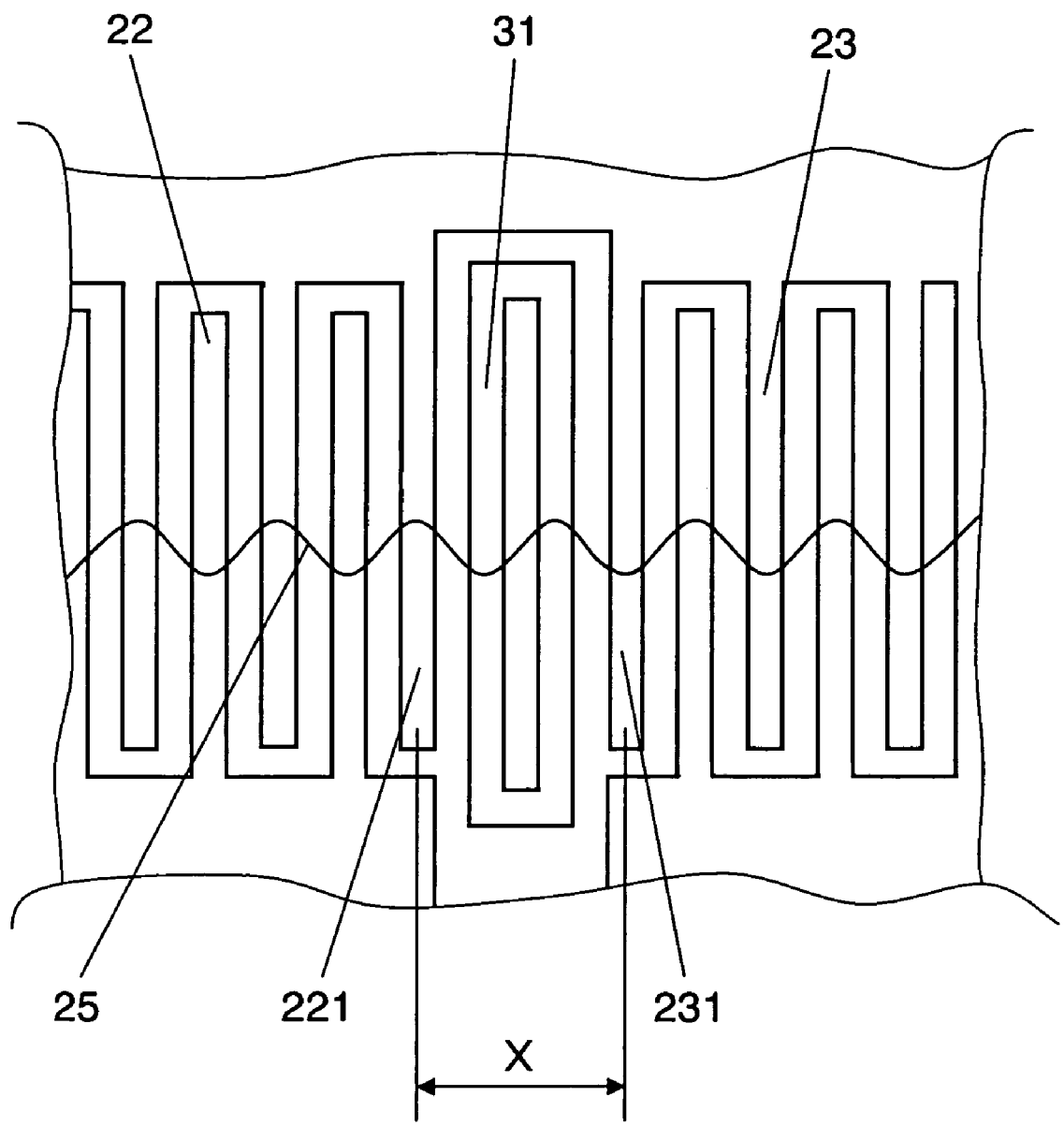
FIG. 2 is a schematic diagram for explaining a reversed phase configuration in the same embodiment.

The reversed phase in the present invention means a configuration as shown in FIG. 2. FIG. 2 is a schematic diagram for explaining the reversed phase, and shows it by enlarging a boundary area portion of first IDT 22 and second IDT 23. In this figure, strip line electrode 31 is disposed between first IDT 22 and second IDT 23. Surface acoustic wave 25, which is excited from first IDT 22 and second IDT 23, is also shown schematically. In the case of such a configuration, as shown in the figure, peaks and troughs of surface acoustic wave 25 are formed by electrode finger 221 which is the closest to second IDT 23, in first IDT 22, and electrode finger 231 which is the closest to first IDT 22, in second IDT 23, and one comb-shaped electrodes, which configure first IDT 22 and second IDT 23, are connected in common. The reversed phase in the present invention means such a configuration. In order to realize such a reversed phase, strip line electrode 31 shown in the figure is not indispensable, and the reversed phase configuration is possible without disposing strip line electrode 31.

In the SAW filter of this embodiment, reflector electrode 207 is utilized, but the present invention is not limited to this. That is, in the case of such a configuration that containment of surface acoustic waves can be realized sufficiently, it is all right even if reflector electrode 207 is not utilized.

Figure 3:
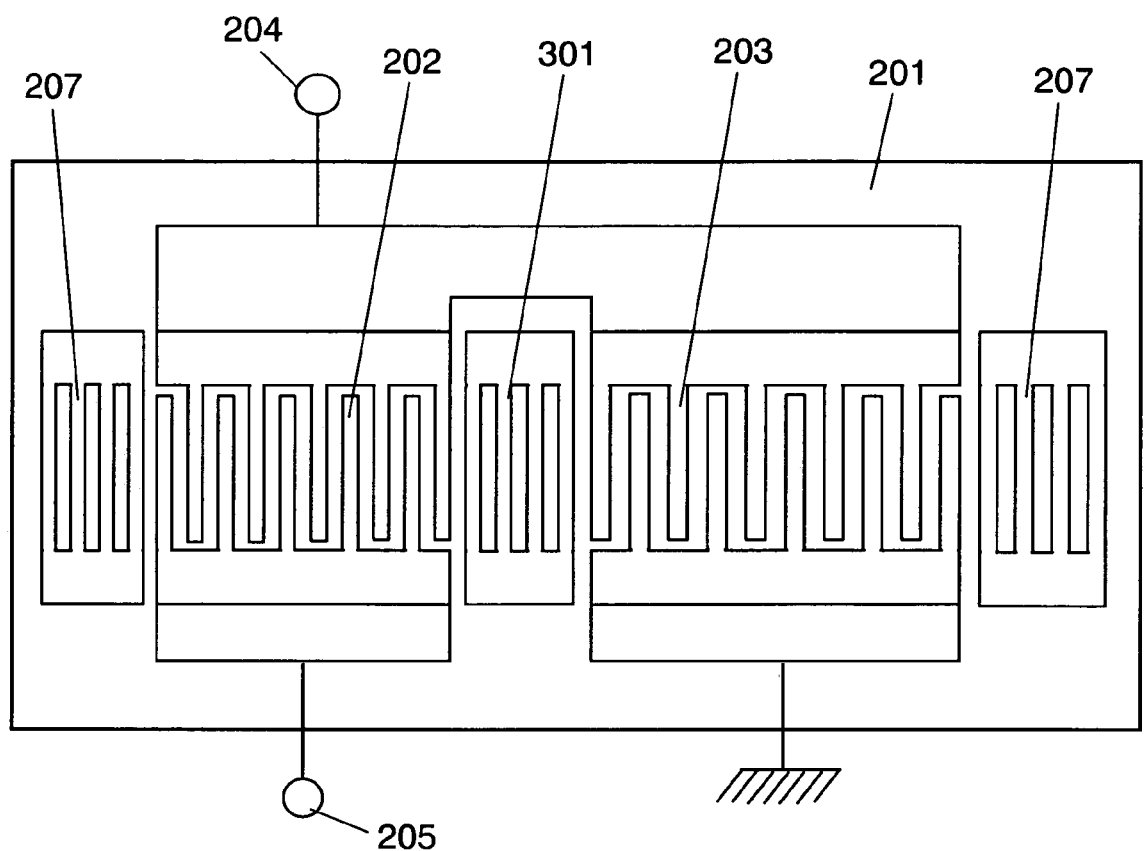
FIG. 3 is a plan view showing a SAW filter of a first modified example in the same embodiment.

FIG. 3 is a plan view showing a SAW filter of a first modified example in this embodiment. Also in the SAW filter of this modified example, only a configuration on piezoelectric substrate 201 is shown in the same manner as in FIG. 1. This SAW filter of the first modified example is characterized in that strip line electrode 301 is arranged between first IDT 202 and second IDT 203. It is preferable that its electrode finger pitch is set up so as to be an intermediate value between an electrode finger pitch of first IDT 202 and an electrode finger pitch of second IDT 203. A pitch of electrode fingers of strip line electrode 301 is set up so as to be the above-mentioned intermediate value, but there is no need to make all pitches of electrode fingers constant, and it is all right even if it is changed in a stepwise fashion and it is also all right even if it is made as a gradation in which it is changed continuously. This strip line electrode 301 is operated as a reflector electrode.

Figure 4:
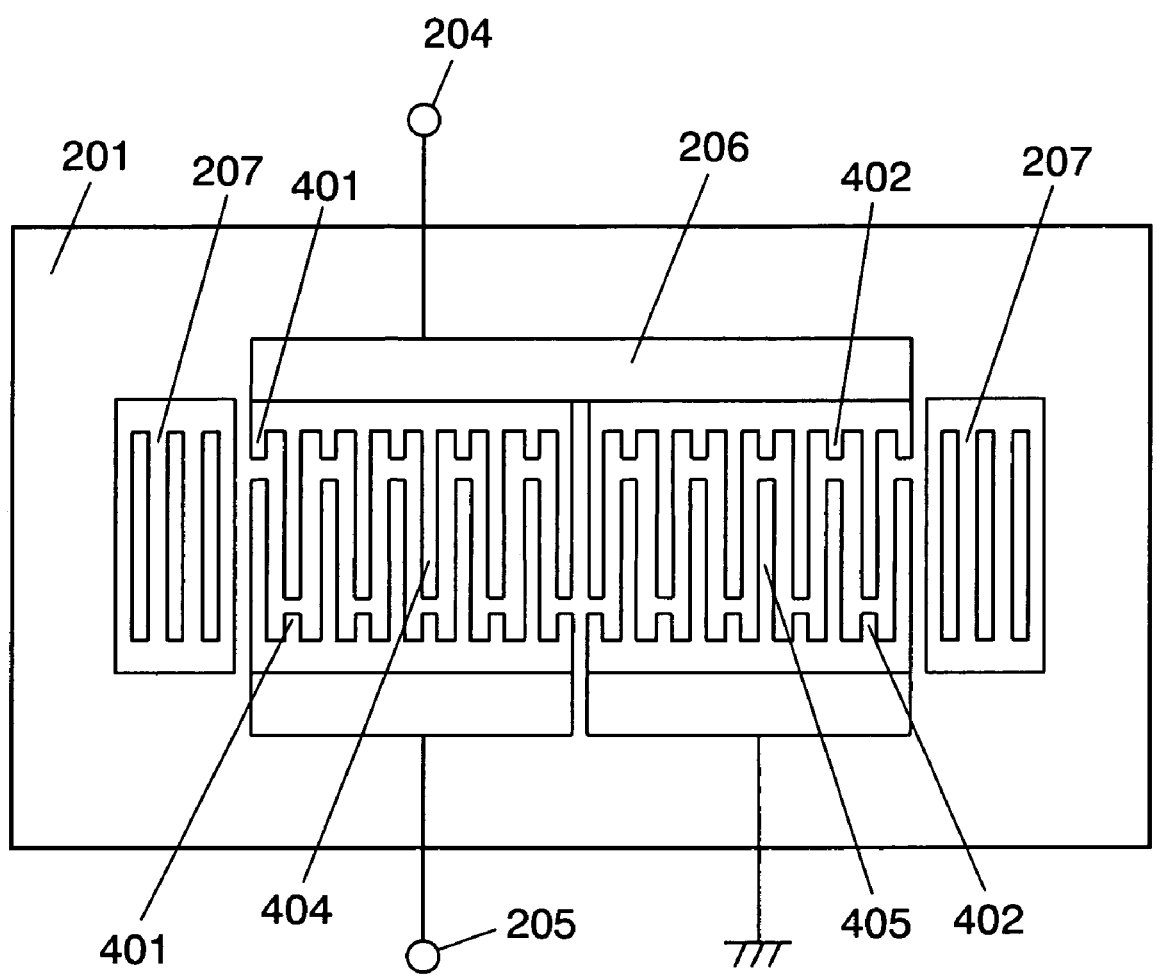
FIG. 4 is a plan view showing a SAW filter of a second modified example in the same embodiment.

FIG. 4 is a plan view showing a SAW filter of a second modified example in this embodiment. Also in the SAW filter of this modified example, only a configuration on piezoelectric substrate 201 is shown in the same manner as in FIG. 1. This SAW filter of the second modified example is characterized in that dummy electrodes 401, 402 shown in the figure are disposed on first IDT 404 and second IDT 405, respectively, and others are the same as the SAW filter configuration shown in FIG. 1. By arranging these dummy electrodes 401, 402 respectively to carry out optimization, it is possible to realize a SAW filter with much lower loss.

In the above-described embodiment, a one stage, L-type configuration SAW filter was explained, but the present invention is not limited to this. For example, it is all right even if a multiple stage configuration SAW filter shown in FIG. 5 is realized.

Figure 5:
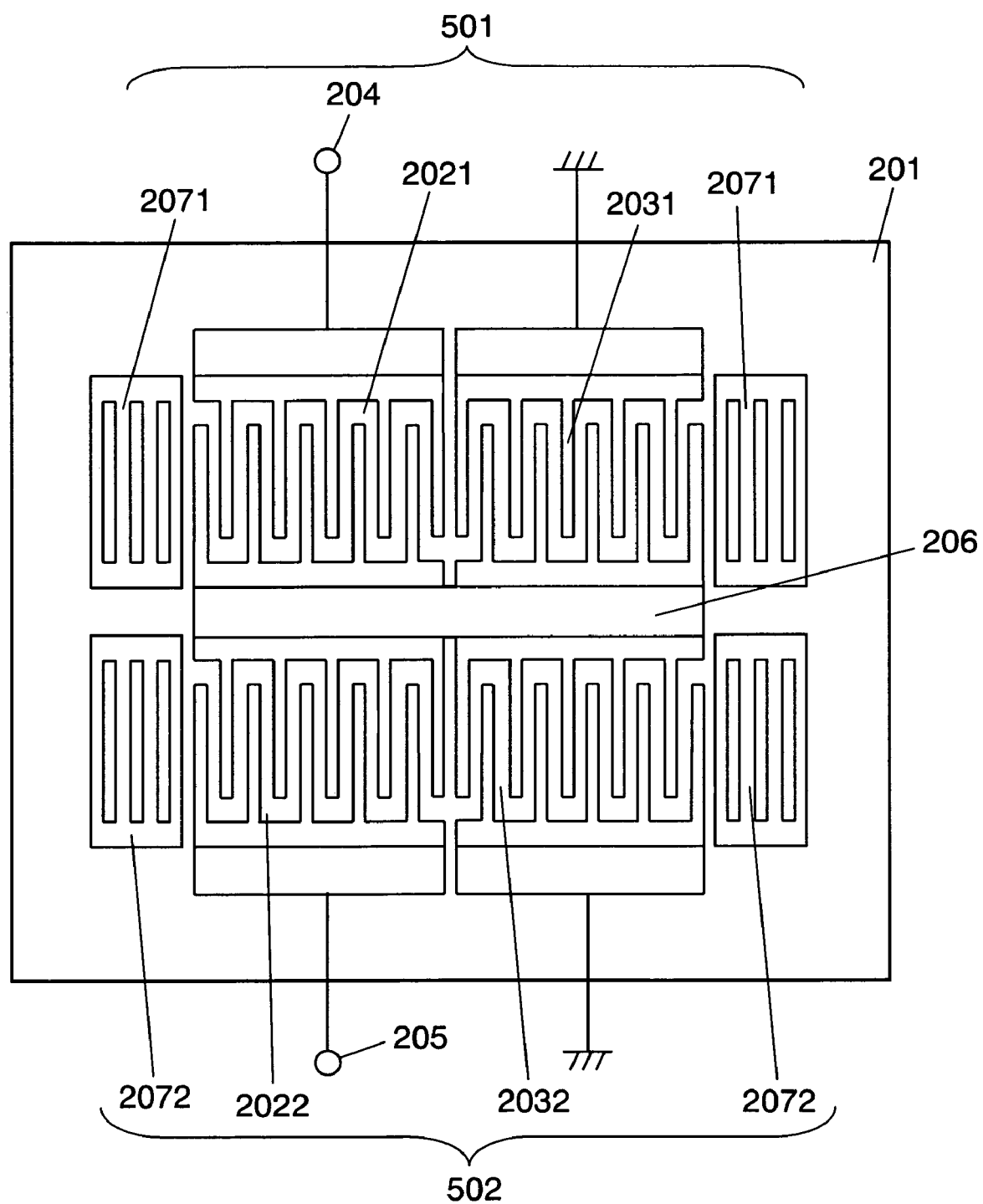
FIG. 5 is a plan view of a SAW filter which is formed in a one stage L-type configuration, which relates to the same embodiment, is used as a basic SAW element, and these SAW elements are cascade-connected in two stages.

FIG. 5 is a plan view of a SAW filter which is formed by such a configuration that the one stage, L type configuration SAW filter shown in FIG. 1 is used as a basic SAW element and these SAW elements are cascade-connected in two stages. First SAW element 501 is formed by such a configuration that first IDT 2021 and second IDT 2031 are arranged on a surface of piezoelectric substrate 201 so as to be located on the same propagation path, and reflector electrodes 2071 are disposed on respective end portions. Second SAW element 502 is formed by such a configuration that first IDT 2022 and second IDT 2032 are arranged on a surface of piezoelectric substrate 201 so as to be located on the same propagation path and reflector electrodes 2072 are disposed on respective end portions, in the same manner.

One of the comb-shaped electrodes comprised in first IDT 2021 is connected to one terminal 204 of input/output terminals, and the other of the comb-shaped electrodes is connected to wiring electrode 206. One of the comb-shaped electrodes comprised in second IDT 2031 is connected to earth, and the other is connected to wiring electrode 206.

One of the comb-shaped electrodes comprised in first IDT 2022 is connected to one terminal 205 of input/output terminals, and the other of the comb-shaped electrodes is connected to wiring electrode 206. One of the comb-shaped electrodes comprised in second IDT 2032 is connected to earth, and the other is connected to wiring electrode 206.

By adopting such a configuration, a pattern shape including IDTs and reflector electrodes formed on piezoelectric substrate 201 becomes almost a rectangular shape as a whole. Therefore, a space factor of a pattern on a chip is improved. As a consequence, miniaturization of a chip bearing a SAW filter becomes possible. The connection between first SAW element 501 and second SAW element 502 is realized only by wiring electrode 206, and since a very simple configuration is realized, realization of a low loss can be carried out.

Hereinafter, a concrete configuration of a SAW filter which relates to this embodiment and a result of its characteristic which was obtained by simulation will be explained.

Figure 6:
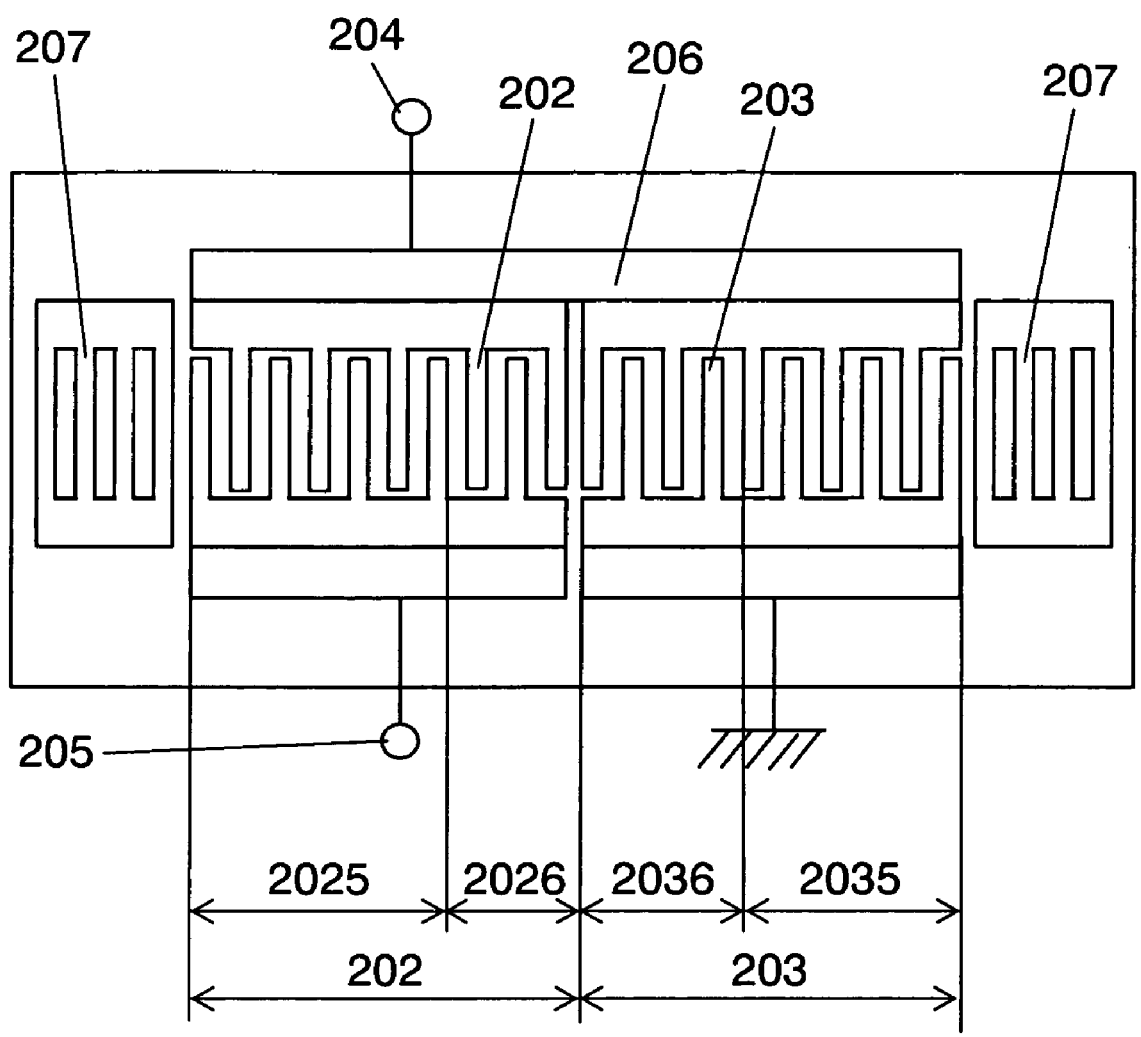
FIG. 6 is a plan view depicting a configuration in which the SAW filter shown in FIG. 1 is used as a basis, and in which a gradation area is disposed.

FIG. 6 is a plan view explaining such a configuration that the SAW filter shown in FIG. 1 is used as a basis and a gradation area is disposed. This SAW filter is formed by such a configuration in which first IDT 202 and second IDT 203 have different resonance frequencies, and as to first IDT 202 and second IDT 203, electrode fingers of comb-shaped electrodes which configure IDTs are arranged almost continuously in such a manner that respective surface acoustic waves are not negated. Hereinafter, this SAW filter is called as a SAW filter of a practical example 1.

Figure 7:
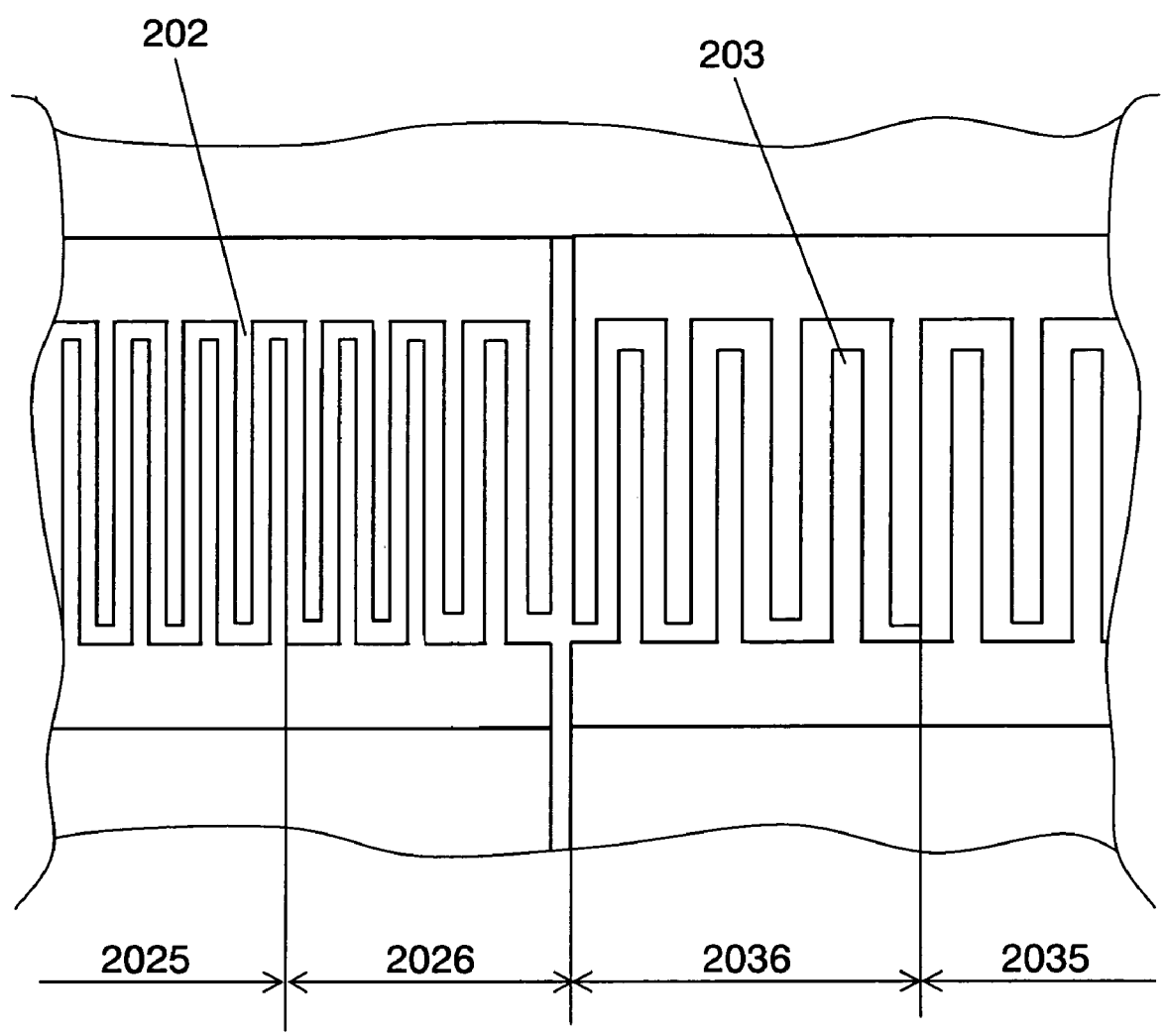
FIG. 7 is a view showing an enlarged view of a configuration of the electrode fingers in a boundary area of the SAW filter shown in FIG. 6.

Concretely speaking, this SAW filter of the practical example 1 is characterized by a configuration such that a pitch of multiple electrode fingers of gradation areas 2026, 2036, which are boundary areas of first IDT 202 and second IDT 203, is differentiated from a pitch of electrode fingers of equal pitch areas 2025, 2035 at respective center areas, i.e., gradation is disposed. FIG. 7 is a view showing an enlarged view of a configuration of electrode fingers in this boundary area. FIG. 7 is a schematic view, and does not express the number of electrode fingers, etc., accurately. TABLE 1 shows the number of electrode fingers and pitches of this SAW filter.

As understood from TABLE 1 and FIG. 7, 215 electrode fingers are disposed in equal pitch area 2025 of first IDT 202, and a pitch in this area is 2.341 μm. Gradation area 2026 is disposed in a region from an end portion of this equal pitch area 2025 up to a boundary portion of second IDT 203. The number of electrode fingers in gradation area 2026 is 10, and its pitch is changed continuously from 2.341 μm as a pitch of end portions near the equal pitch area up to 2.411 μm as a pitch near the boundary portion of second IDT 203.

Gradation area 2036 of second IDT 203 is changed continuously from 2.411 μm as a pitch of end portions near gradation area 2026 of first IDT 202 up to 2.429 μm as a pitch of equal pitch area 2035. The number of electrode fingers in this gradation area 2036 is 10, and the number of electrode fingers in equal pitch area 2035 is 135.

Figure 8:
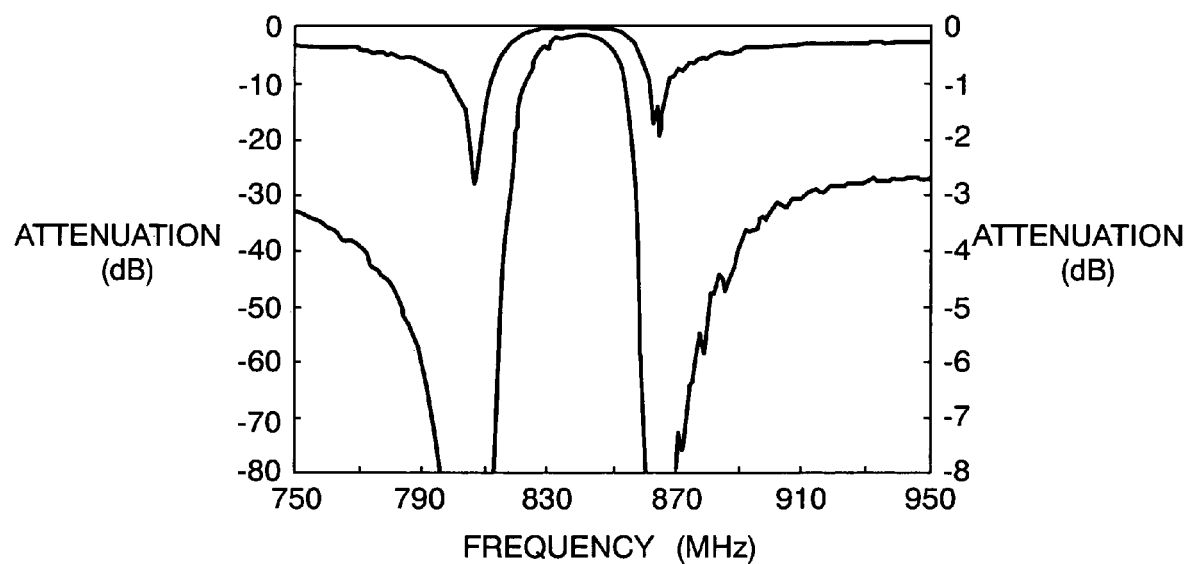
FIG. 8 is a graph showing a result of measuring the characteristic of a SAW filter of practical example 1.

The number of electrode fingers of reflector electrode 207 which is adjacent to first IDT 202 is 35, and its pitch is set to 2.404 μm. The number of electrode fingers of reflector electrode 207 which is adjacent to second IDT 203 is 35, and its pitch is set to 2.418 μm. Piezoelectric substrate 201 is formed by lithium tantalate (LiTaO$_3$) of 39 Y-cut X propagation, and an electrode film thickness is set to approximately 0.4 μm. A characteristic of the SAW filter of practical example 1 which is formed by the above-mentioned configuration is obtained, and its result is shown in FIG. 8. As understood from FIG. 8, in the SAW filter of practical example 1, losses at 824 MHz and 849 MHz were 0.65 dB and 0.28 dB.

TABLE 1

| | | Number of Electrode Fingers (piece) | Pitch (μm) |
|---|---|---|---|
| Reflector Electrode 207 | | 35 | 2.404 |
| First IDT 202 | Equal Pitch Area 2025 | 215 | 2.341 |
| | Gradation Area 2026 | 10 | 2.411 (right end portion of first IDT 202) |
| Second IDT 203 | Gradation Area 2036 | 10 | 2.411 (left end portion of second IDT 203) |
| | Equal Pitch Area 2035 | 135 | 2.429 |
| Reflector Electrode 207 | | 35 | 2.418 |

*An overlap length is 115 μm, and η is 0.52, and made constant.

Next, in the same manner as the SAW filter of practical example 1, a SAW filter was manufactured such that thinned-out apodization was further added to a configuration wherein a gradation area is disposed. This is called as a SAW filter of practical example 2. The SAW filter of practical example 2 is the same as the SAW filter of practical example 1 as to its configuration, but the number of electrode fingers and a pitch are different.

TABLE 2 shows the number of electrode fingers and pitches of the SAW filter of practical example 2. As to things other than the configuration shown in TABLE 2, they are the same as those of the SAW filter of practical example 1, and therefore, explanations will be omitted.

Figure 9:
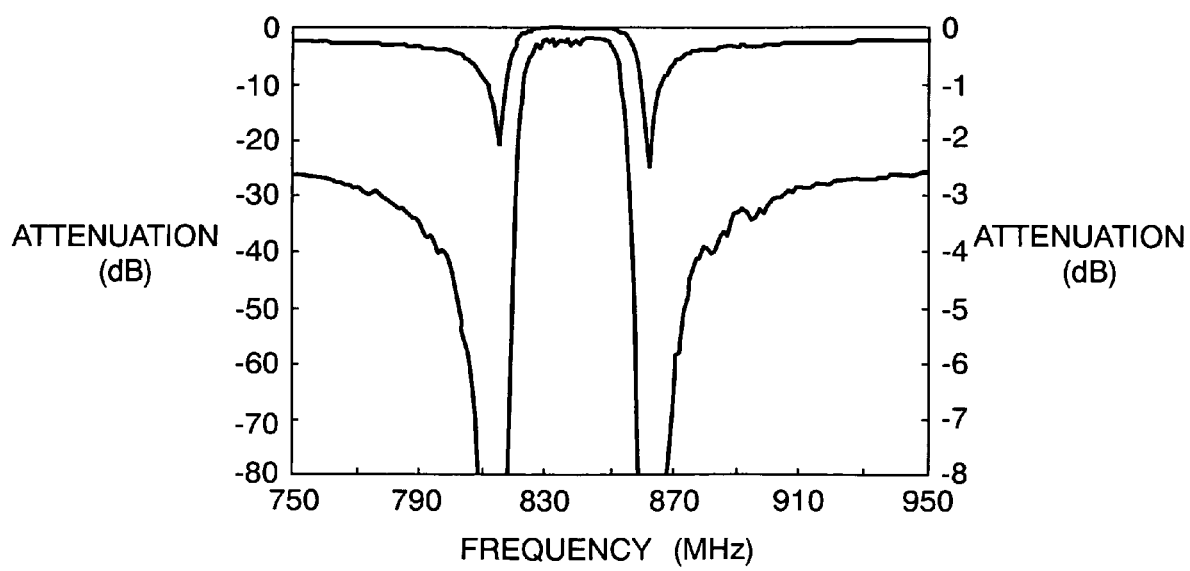
FIG. 9 is a graph showing a result of measuring the characteristic of a SAW filter of practical example 2.

A characteristic of the SAW filter of practical example 2, which is formed by the above-mentioned configuration, is obtained, and its result is shown in FIG. 9. As understood from FIG. 9, in the SAW filter of practical example 2, losses at 824 MHz and 849 MHz were 0.52 dB and 0.29 dB.

TABLE 2

| | | Number of Electrode Fingers (piece) | Pitch (μm) |
|---|---|---|---|
| Reflector Electrode 207 | | 35 | 2.383 |
| First IDT 202 | Equal Pitch Area 2025 | 215 | 2.321 |
| | Gradation Area 2026 | 10 | 2.390 (right end portion of first IDT 202) |
| Second IDT 203 | Gradation Area 2036 | 10 | 2.390 (left end portion of second IDT 203) |
| | Equal Pitch Area 2035 | 135 | 2.408 |
| Reflector Electrode 207 | | 35 | 2.397 |

*An overlap length is 115 μm, and η is 0.52, and made constant.

Figure 10:
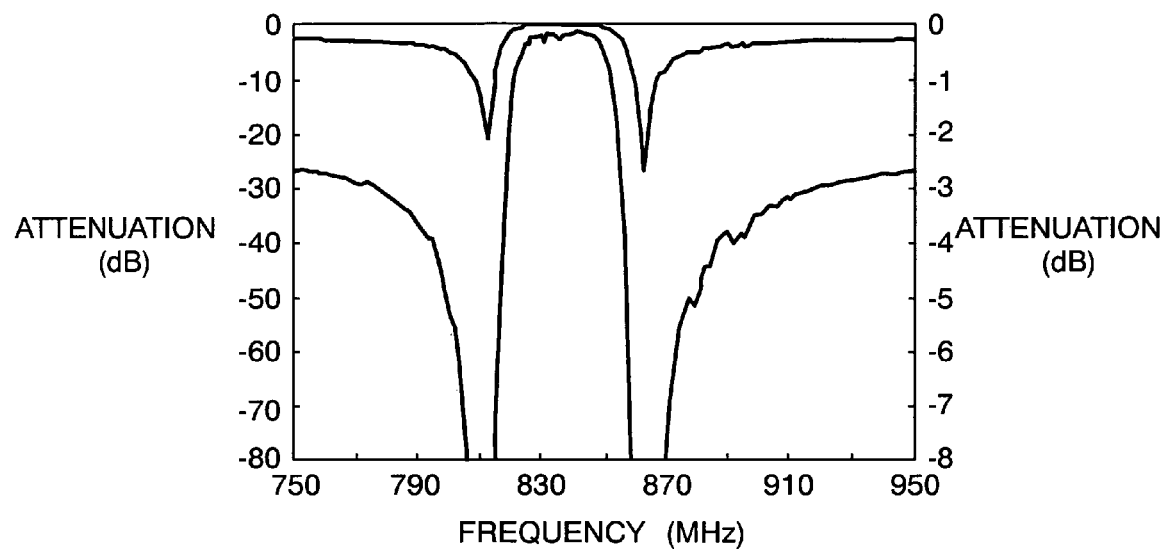
FIG. 10 is a graph showing a result of measuring the characteristic of a SAW filter of practical example 3.

In the same manner as the SAW filter of practical example 1, a SAW filter was manufactured in which a weighting method was further added to a configuration wherein a gradation area is disposed. This is called as a SAW filter of practical example 3. As to the weighting method, its optimum value was set up by evaluating a characteristic by simulation. A characteristic of the SAW filter of practical example 3 which was manufactured in this manner was obtained, and its result is shown in FIG. 10. As understood from FIG. 10, in the SAW filter of practical example 3, losses at 824 MHz and 849 MHz were 0.56 dB and 0.28 dB.

Figure 11:
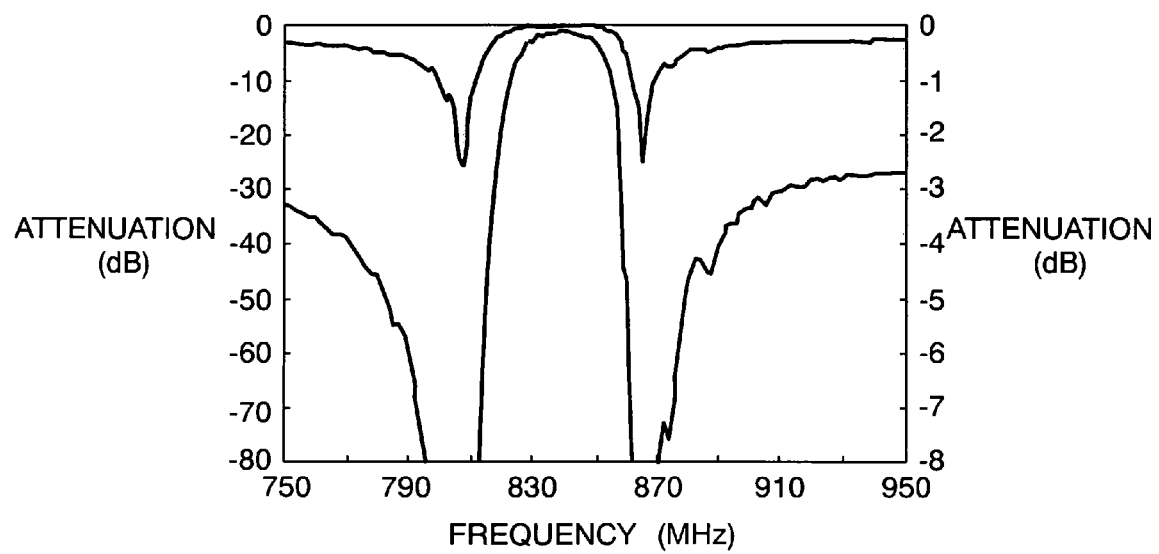
FIG. 11 is a graph showing a result of measuring the characteristic of a SAW filter of comparative example 1.

In order to compare with a SAW filter of the present invention, a SAW filter was manufactured which was formed a conventional ladder mode configuration. This is called as a SAW filter of comparative example 1. A characteristic of the SAW filter of comparative example 1 was measured, and its result is shown in FIG. 11. As understood from FIG. 1, in the SAW filter of comparative example 1, losses at 824 MHz and 849 MHz were 0.65 dB and 0.28 dB.

These characteristics are shown collectively in TABLE 3. As understood from TABLE 3, it can be confirmed that the SAW filters of practical example 2 and practical example 3 can obtain a more favorable characteristic than that of the SAW filter of comparative example 1, except for the SAW filter of practical example 1. In case of the SAW filter of practical example 1, its characteristic was the same as that of the SAW filter of comparative example 1, but it is characterized in that it is possible to miniaturize it much more than the SAW filter of comparative example 1.

TABLE 3

| | SAW filter of Practical Example 1 | SAW filter of Practical Example 2 | SAW filter of Practical Example 3 | SAW filter of Comparative Example 1 |
|---|---|---|---|---|
| 824 MHz | 0.65 dB | 0.52 dB | 0.56 dB | 0.65 dB |
| 894 MHz | 0.28 dB | 0.29 dB | 0.28 dB | 0.28 dB |

Next, a SAW filter was manufactured which was configured in such a manner that a strip line electrode is disposed between a first IDT and a second IDT, and electrode fingers of comb-shaped electrodes comprised in the first IDT and the second IDT, and electrode fingers comprised in the strip line electrode or a reflector electrode are arranged so as to become almost continuous. This is based on the SAW filter shown in FIG. 3, and the number of electrode fingers and pitches of the manufactured SAW filter are shown in TABLE 4. This is called a SAW filter of practical example 4.

Figure 12:
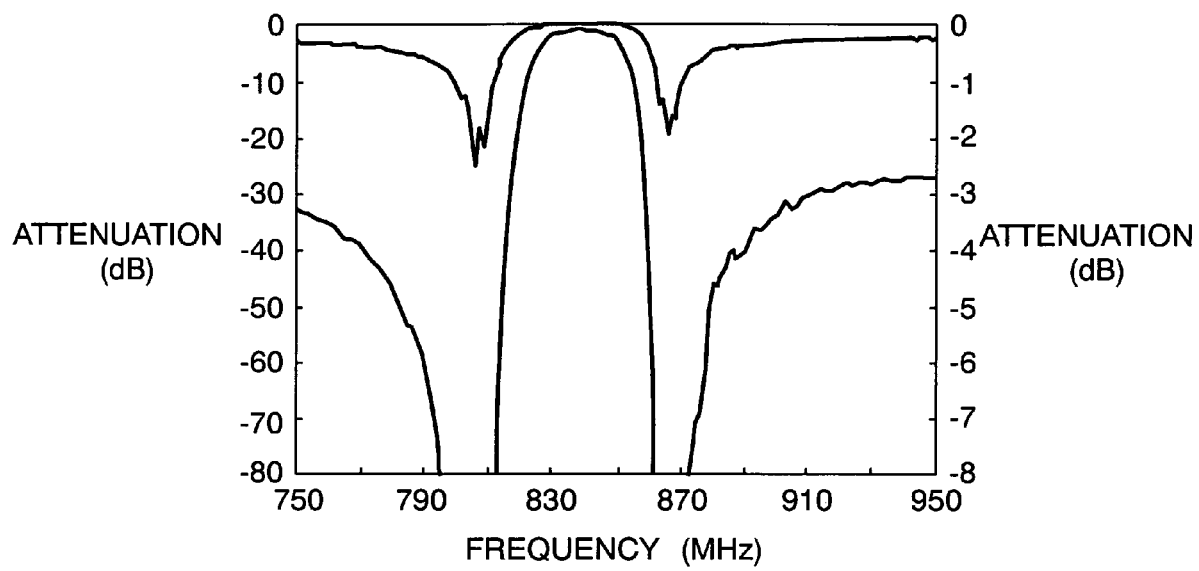
FIG. 12 is a graph showing a result of measuring the characteristic of a SAW filter of practical example 4.

A characteristic of the SAW filter of practical example 4 manufactured based on TABLE 4 was obtained, and its result is shown in FIG. 12. As understood from FIG. 12, in the SAW filter of practical example 4, losses at 824 MHz and 849 MHz were 0.70 dB and 0.25 dB.

TABLE 4

| | Number of Electrode Fingers (piece) | Pitch (μm) |
|---|---|---|
| Reflector Electrode 207 | 35 | 2.404 |
| First IDT 202 | 225 | 2.341 |
| Strip Line Electrode 301 | 35 | 2.411 |
| Second IDT 203 | 145 | 2.429 |
| Reflector Electrode 207 | 35 | 2.418 |

Figure 13:
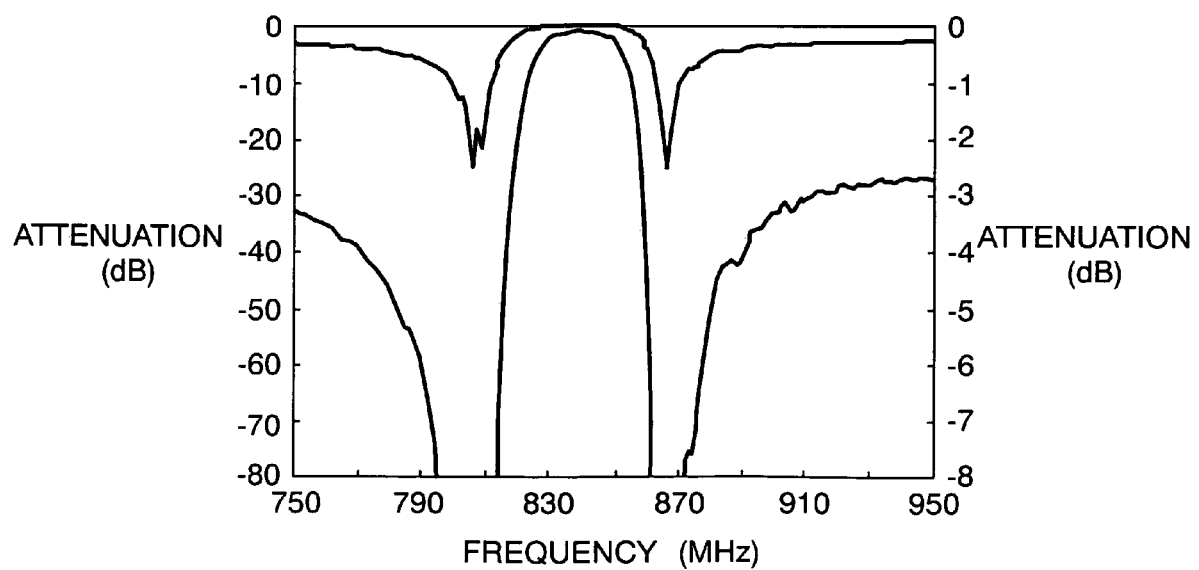
FIG. 13 is a graph showing a result of measuring the characteristic of a SAW filter of comparative example 2.

In order to compare with the SAW filter of practical example 4, a SAW filter was also manufactured of a conventional ladder mode configuration. This is called a SAW filter of comparative example 2. A characteristic of the SAW filter of comparative example 2 was measured, and its result is shown in FIG. 13. As understood from FIG. 13, in the SAW filter of the comparative example 2, losses at 824 MHz and 849 MHz were 0.70 dB and 0.25 dB.

In the case of the SAW filter of practical example 4, a characteristic itself was the same as that of a conventional ladder mode configuration, but it is characterized in that miniaturization is possible.

Next, a SAW filter was manufactured in which the SAW filter shown in FIG. 3 is used as a basic SAW element and these things are cascade-connected in multiple stages, and its characteristic was obtained, and its result will be described.

Figure 14:
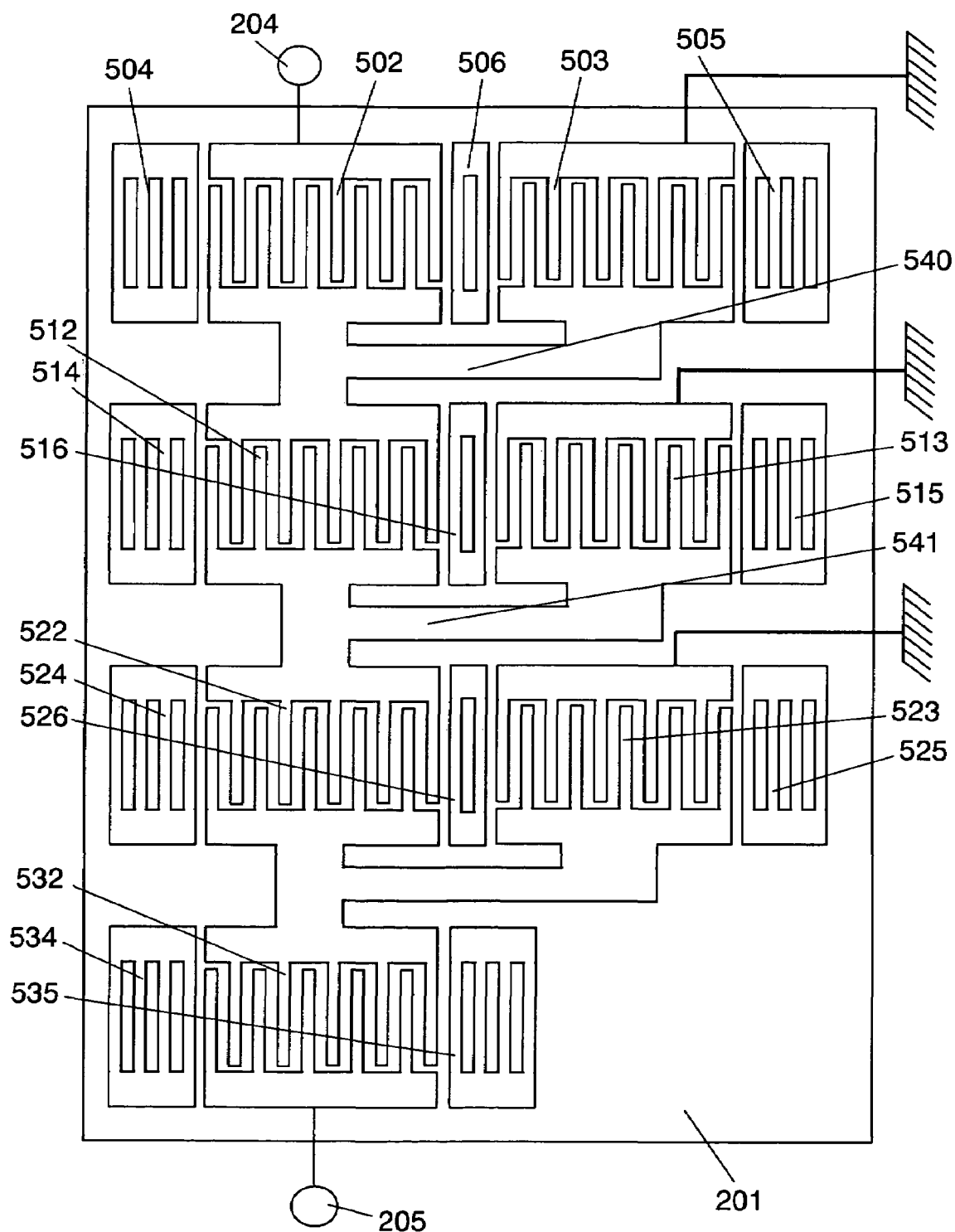
FIG. 14 is a plan view of a SAW filter of practical example 5 which is configured in such a manner that the SAW filter shown in FIG. 3 is used as a basic SAW element, and these SAW elements are cascade-connected in four stages.

FIG. 14 is a plan view of a SAW filter which is configured in such a manner that the SAW filter shown in FIG. 3 is used as a basic SAW element and these SAW elements are cascade-connected in 4 stages. This is called a SAW filter of practical example 5. Piezoelectric substrate 201 is formed by use of lithium tantalate (LiTaO$_3$) of 39° Y-cut X propagation, and an electrode film thickness is set to approximately 0.4 μm. The number of electrode fingers and pitches of respective IDTs and reflector electrodes from a first stage up to a fourth stage are shown in TABLE 5.

A first stage of this SAW filter of practical example 5 is configured by first IDT 502, second IDT 503, reflector electrodes 504, 505 on both sides, and strip line electrode 506 at a center portion. A second stage is configured by first IDT 512, second IDT 513, reflector electrodes 514, 515 on both sides, and strip line electrode 516 at a center portion. A third stage is configured by first IDT 522, second IDT 523, reflector electrodes 524, 525 on both sides, and strip line electrode 526 at a center portion. A final fourth stage is configured by first IDT 532, and reflector electrodes 534, 535 which are arranged on both sides thereof.

TABLE 5

| First Stage | | | | | |
|---|---|---|---|---|---|
| | Reflector Electrode 504 | First IDT 502 | Strip Line Electrode 506 | Second IDT 503 | Reflector Electrode 505 |
| Overlap lengths (μm) | — | 115 | — | 115 | — |
| Number of Electrode Fingers (piece) | 35 | 225 | 23 | 145 | 35 |
| Electrode Finger Pitch (μm) | 2.404 | 2.341 | 2.411 | 2.429 | 2.418 |
| Second Stage | | | | | |
| | Reflector Electrode 514 | First IDT 512 | Strip Line Electrode 516 | Second IDT 513 | Reflector Electrode 515 |
| Overlap lengths (μm) | — | 55 | — | 55 | — |
| Number of Electrode Fingers (piece) | 35 | 157 | 23 | 181 | 35 |
| Electrode Finger Pitch (μm) | 2.404 | 2.334 | 2.411 | 2.427 | 2.418 |
| Third Stage | | | | | |
| | Reflector Electrode 524 | First IDT 522 | Strip Line Electrode 526 | Second IDT 523 | Reflector Electrode 525 |
| Overlap lengths (μm) | — | 75 | — | 75 | — |
| Number of Electrode Fingers (piece) | 35 | 201 | 23 | 153 | 35 |
| Electrode Finger Pitch (μm) | 2.415 | 2.434 | 2.406 | 2.309 | 2.392 |
| Fourth Stage | | | | | |
| | Reflector Electrode 534 | | First IDT 532 | | Reflector Electrode 535 |
| Overlap lengths (μm) | — | | 40 | | — |
| Number of Electrode Fingers (piece) | 35 | | 235 | | 35 |
| Electrode Finger Pitch (μm) | 2.411 | | 2.334 | | 2.411 |

These IDTs are connected by wiring electrodes 540, 541, 542.

One of the comb-shaped electrodes, comprised in first IDT 502 at a first stage is connected to one terminal 204 of input/output terminals, and the other of the comb-shaped electrodes, comprised in first IDT 532 at a fourth stage is connected to other terminal 205 of input/output terminals. Strip line electrodes 506, 516, 526 are operated as reflector electrodes.

Figure 15:
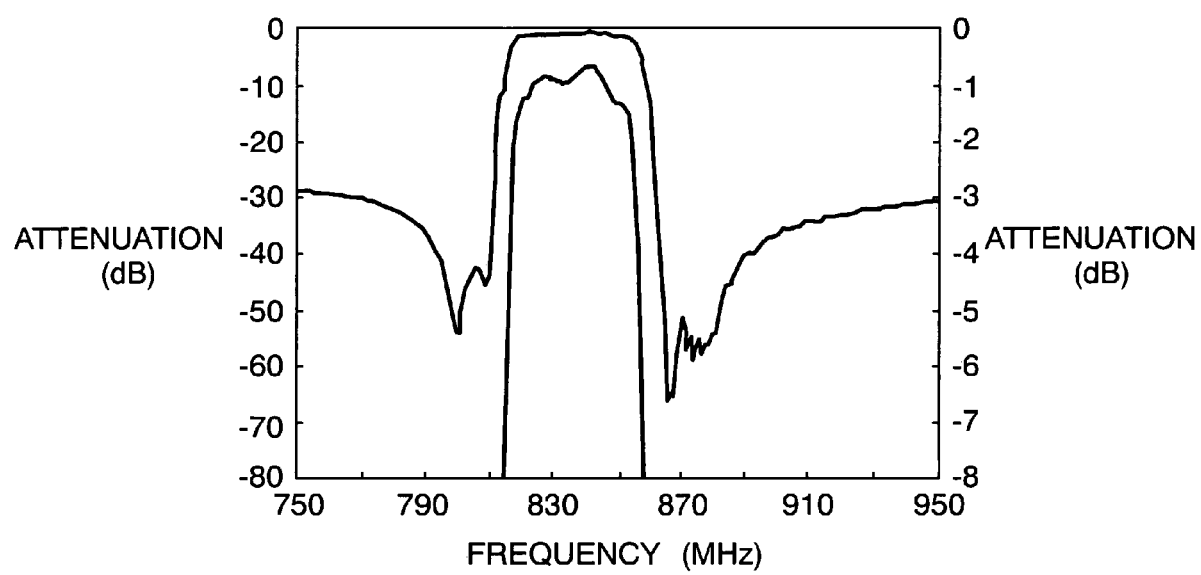
FIG. 15 is a graph showing a result of measuring the characteristic of a SAW filter of the practical example 5.

FIG. 15 is a graph showing a result of measuring the characteristic of a SAW filter of practical example 5 with such a configuration. As understood from FIG. 15, in a SAW filter of practical example 5, losses at 824 MHz and 849 MHz were 0.92 dB and 1.29 dB.

Figure 16:
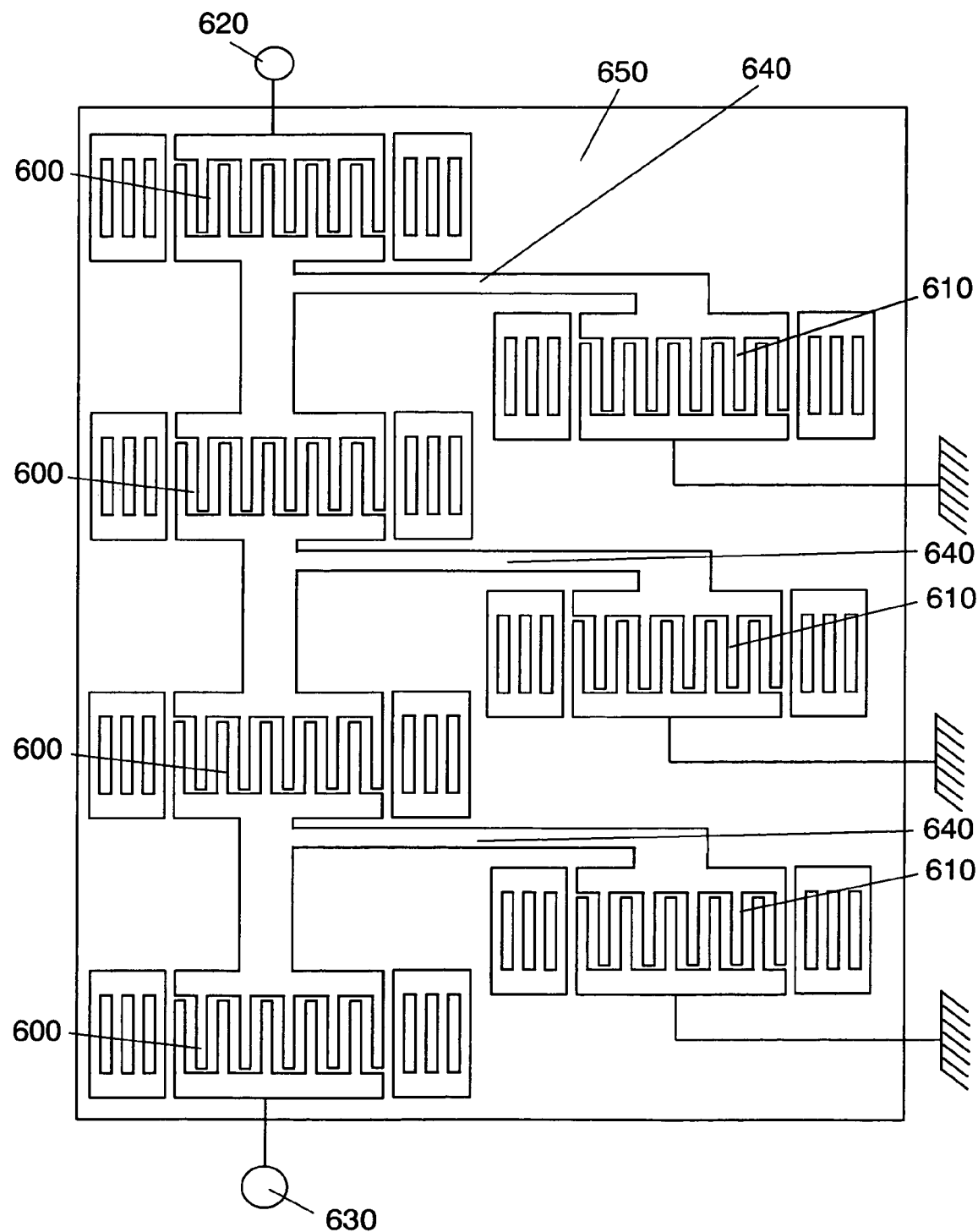
FIG. 16 is a plan view showing a configuration of a SAW filter of comparative example 3, which is produced for comparison and in which SAW resonators formed by a conventional ladder configuration are cascade-connected in multiple stages.

In order to compare with this SAW filter, a SAW filter was manufactured of such a configuration that SAW resonators, which are formed by a conventional ladder mode configuration, are cascade-connected in multiple stages. FIG. 16 is a plan view showing a configuration of this SAW filter. This SAW filter is comprised of SAW resonators 600 forming a serial arm on piezoelectric substrate 650, SAW resonators 610 forming a parallel arm, and signal line 640 connected to these SAW resonators 600, 610. SAW resonators 600 of a serial arm are connected to one terminal 620 and other terminal 630 of input/output terminals, respectively. The number of electrode fingers, a pitch, overlap lengths, etc., are set up to be matched with a pass band of the SAW filter of practical example 5.

Figure 17:
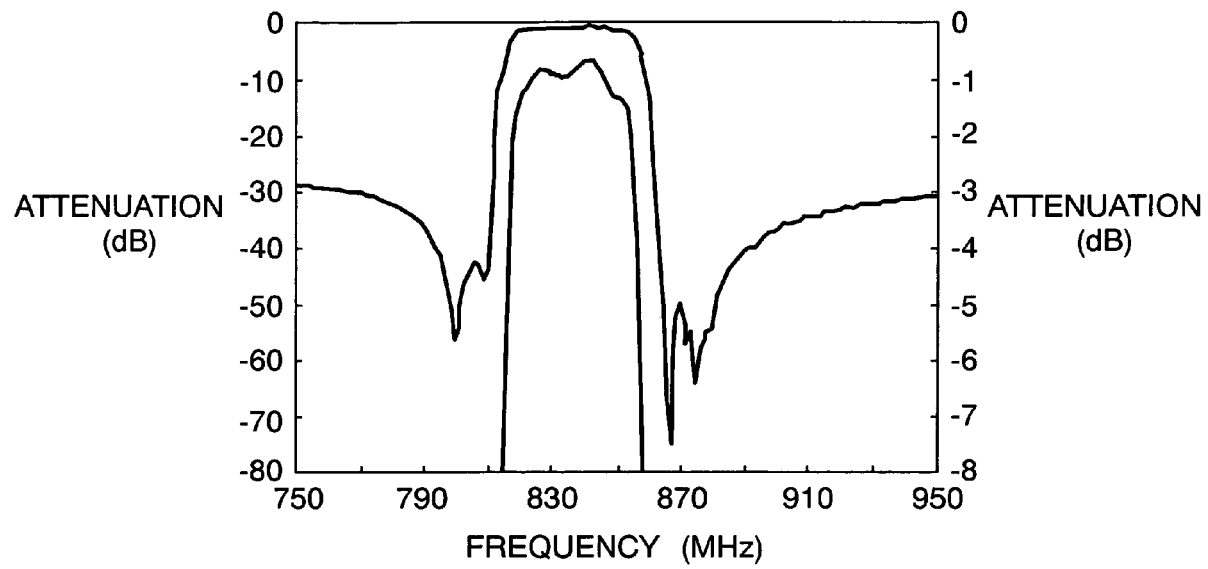
FIG. 17 is a graph showing a result of measuring the characteristic of the SAW filter of comparative example 3.

A SAW filter of such a configuration is hereinafter called a SAW filter of comparative example 3. FIG. 17 is a graph showing a result of measuring the characteristic of a SAW filter of this comparative example 3. As understood from FIG. 17, in the SAW filter of comparative example 3, losses at 824 MHz and 849 MHz were 0.93 dB and 1.29 dB.

Judging from these results, the SAW filter of practical example 5 is characterized in that it can be miniaturized as a whole, although an improvement level is small as compared with the SAW filter of comparative example 3.

In the SAW filter shown in the above-described practical example, the gradation is formed in such a manner that a pitch is changed continuously, but the present invention is not limited to this. For example, a pitch may be changed in a stepwise fashion. In the SAW filter shown in the above-described practical example in the same manner, a configuration was shown such that a weighting method was applied to the IDT, but there is no limitation to such a configuration and a withdrawal weighting method may be applied.

Although it is not explicitly explained, in the first embodiment and the SAW filters of the practical examples manufactured based upon it, resonance frequencies of the first IDT and the second IDT are set to frequencies necessary for obtaining a preset filter characteristic, but it is figured out from TABLE 1 through TABLE 5 and their explanations, as a matter of course. It is possible to obtain a favorable characteristic in the same manner, even if the resonant frequency of the first IDT is nearly matched with the anti-resonance frequency of the second IDT.

In the present invention, it is all right even if it is configured in such a manner that a third IDT, which is connected between a signal path and a ground, is arranged, on a side of the first IDT opposite to the second IDT in such a manner that the electrode fingers of its comb-shaped electrode are continuous with the electrode fingers of the comb-shaped electrode of the first IDT. Alternately, it is also all right even if it is configured in such a manner that a fourth IDT, which is connected serially to a signal path, is arranged, on a side of the second IDT opposite to the first IDT in such a manner that the electrode fingers of its comb-shaped electrode are continuous with the electrode fingers of the comb-shaped electrode of the second IDT. By adopting these configurations, it is possible to realize a SAW filter which is of a small size and a low loss, in the same manner.

SECOND EMBODIMENT

Figure 18:
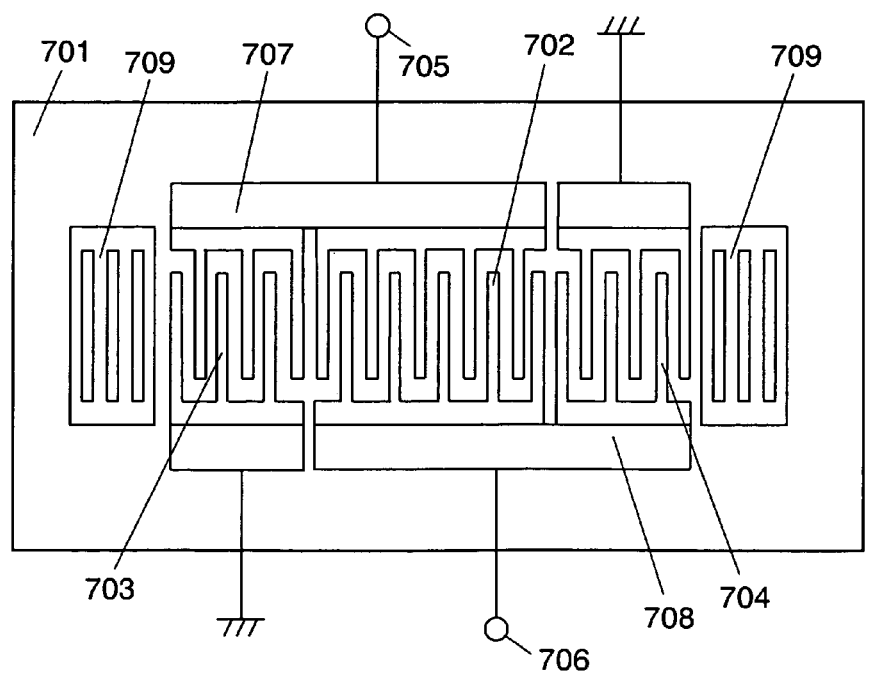
FIG. 18 is a plan view showing a configuration of a SAW filter which relates to a second embodiment of the present invention.

FIG. 18 is a plan view showing a configuration of a SAW filter which relates to a second embodiment of the present invention. A point of difference between the SAW filter of this embodiment and the SAW filter of the first embodiment is that an L-type configuration was mainly used in the first embodiment, whereas in this embodiment, a π-type configuration is mainly used.

The SAW filter of this embodiment comprises first IDT 702, second IDT 703, and third IDT 704 on piezoelectric substrate 701, and reflector electrodes 709 arranged on both ends.

First IDT 702 is arranged between one terminal 705 of the input/output terminals and other terminal 706 of the input/output terminals, i.e., serially to a signal path. By this arrangement, this first IDT 702 can carry out an operation which is equivalent to that of the SAW resonators of a serial arm. Second IDT 703 is arranged in parallel to a signal path from a portion between one terminal 705 of input/output terminals and first IDT 702, and connected to first IDT 702 and one terminal 705 by wiring electrode 707. By this arrangement, second IDT 703 can carry out an operation which is equivalent to that of SAW resonators of a parallel arm.

Third IDT 704 is arranged in parallel to a signal path from a portion between other terminal 706 of the input/output terminals and first IDT 702, and connected to first IDT 702 and other terminal 706 by wiring electrode 708. By this arrangement, third IDT 704 can carry out an operation which is equivalent to that of SAW resonators of a parallel arm.

First IDT 702, second IDT 703 and third IDT 704 are arranged in proximity to one another, on the same propagation path of surface acoustic waves which are excited by each of the SAW resonators. It is configured in such a manner that, at this time, surface acoustic waves, which are excited by the SAW resonators, are not negated by each other. On this account, it is desirable to make them in reversed phases. Reflector electrodes 709 are arranged on end sides of second IDT 703 and third IDT 704, respectively, as shown in the figure. The SAW filter of this embodiment is formed by the above-mentioned configuration.

Electrode finger pitches are set up in such a manner that an electrode finger pitch of first IDT 702 is smaller than electrode finger pitches of second IDT 703 and third IDT 704 and a filter characteristic based on a design value can be obtained. An electrode finger pitch of reflector electrode 709 is set up so as to be an intermediate value of an electrode finger pitch of first IDT 702, and electrode finger pitches of second IDT 703 and third IDT 704.

By adopting the above-mentioned configuration, first IDT 702, second IDT 703 and third IDT 704 in the SAW filter of this embodiment are arranged in proximity to one another, and surface acoustic waves are contained in on the same propagation path. Therefore, respective SAW resonators become equivalent to a filter with a longer resonator length. As a consequence, it is possible to improve a characteristic of SAW resonators, and therefore, it is possible to obtain a band pass type and a small loss characteristic in a SAW filter.

To the degree that first IDT 702, second IDT 703 and third IDT 704 are arranged in proximity to one another and a wiring electrode line length for connecting can be reduced, it is possible to realize miniaturization of a SAW filter. As to such a SAW filter, a π-type configuration is a basic configuration unit.

As explained above, the SAW filter of this embodiment can realize a small size and a small loss characteristic, by arranging a plurality of SAW resonators in proximity to one another on the same propagation path.

In this embodiment, a reflector electrode was arranged, but it is all right even if the reflector electrode is not utilized by use of such a configuration in which it is possible to contain surface acoustic waves in IDTs sufficiently. It is also all right even if it is configured in such a manner that several pieces of reflector electrodes or strip line electrodes are disposed between first IDT 702, second IDT 703 and third IDT 704. It is preferable to set up an electrode finger pitch of these reflector electrodes or strip line electrodes to an intermediate value of an electrode finger pitch of first IDT 702, and electrode finger pitches of second IDT 703 and third IDT 704.

It is all right even if dummy electrodes are arranged on first IDT 702, second IDT 703 and third IDT 704, respectively. By optimizing this configuration of dummy electrodes, it is possible to reduce a loss much more.

Even in this embodiment, it is possible to realize a small size SAW filter, while improving a filter characteristic, by disposing a gradation area as explained in the first embodiment and realizing an apodized weighting method or thinned-out electrode configuration, etc.

THIRD EMBODIMENT

Figure 19:
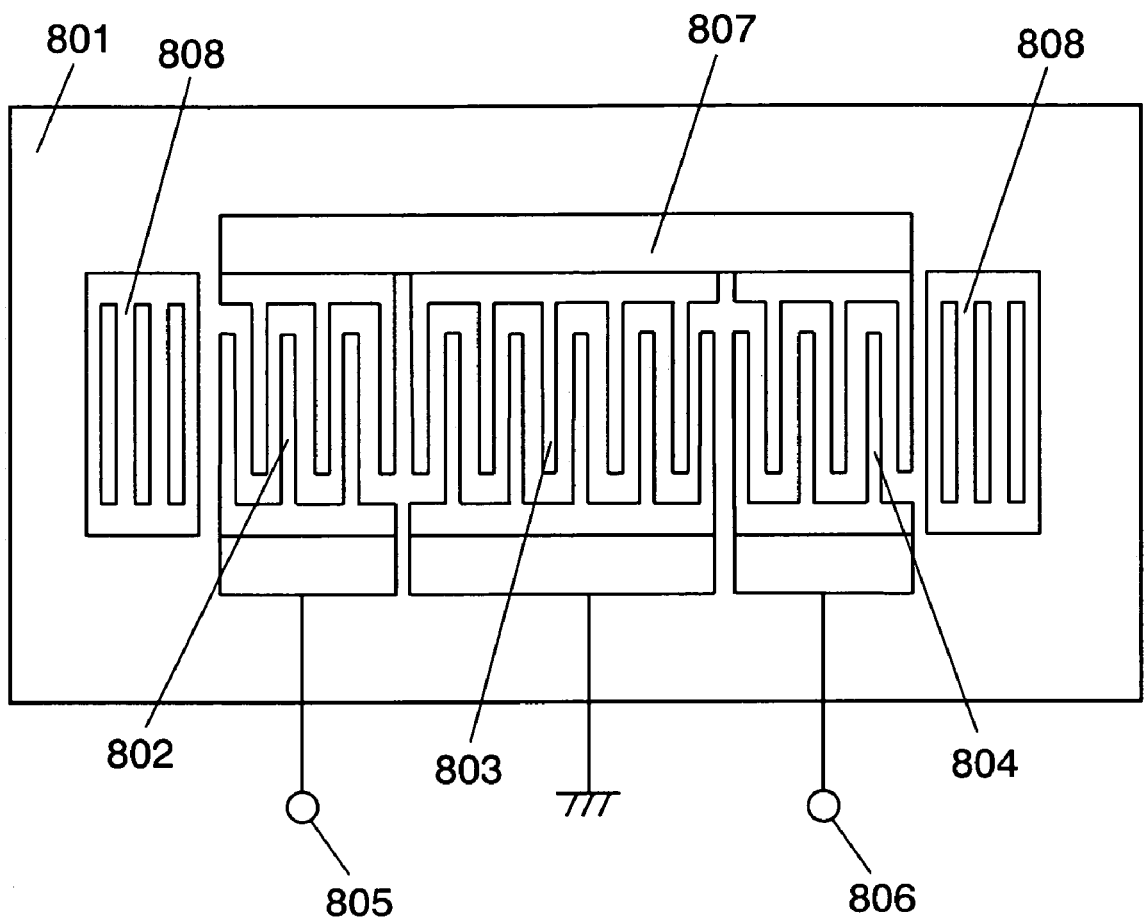
FIG. 19 is a plan view showing a configuration of a SAW filter which relates to a third embodiment of the present invention.
Figure 20:
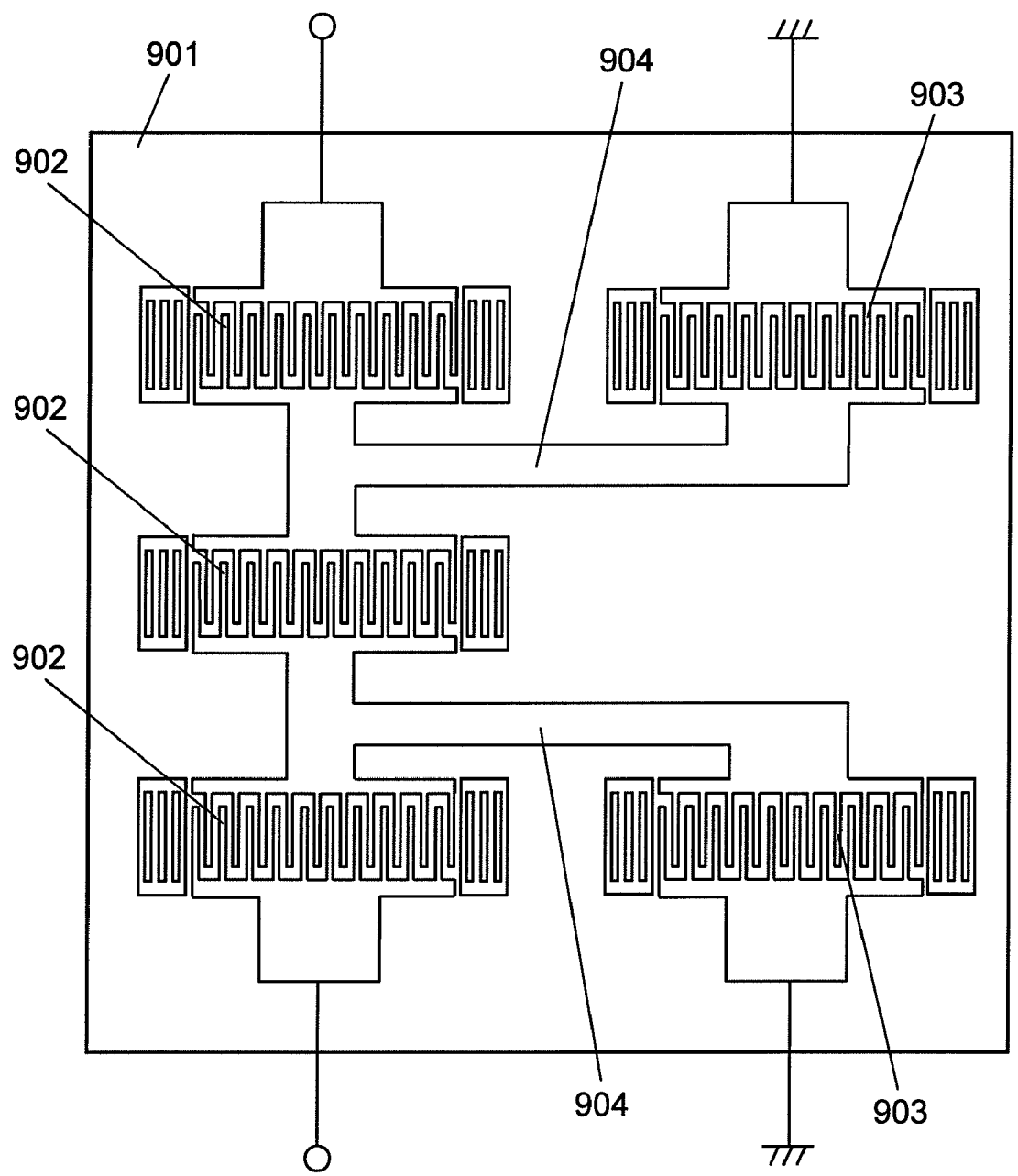
FIG. 20 is a block diagram of a conventional SAW filter disclosed in a first prior art document.

FIG. 19 is a plan view showing a configuration of a SAW filter which relates to a third embodiment of the present invention. A point of difference between the SAW filter of this embodiment and the SAW filter of the first embodiment is that an L type configuration is used in the first embodiment, and a T type configuration is used in this embodiment. As shown in FIG. 19, the SAW filter of this embodiment comprises first IDT 802, second IDT 803, and fourth IDT 804 on piezoelectric substrate 801 and reflector electrodes 808 arranged on both end portions.

First IDT 802 and fourth IDT 804 are arranged between one terminal 805 of the input/output terminals and other terminal 806 of the input/output terminals, i.e. serially to a signal path. By this configuration, these things can carry out an operation which is equivalent to that of SAW resonators of a serial arm.

Second IDT 803 is arranged in parallel to a signal path from a portion between first IDT 802 and fourth IDT 804. This second IDT 803 is connected to one of comb-shaped electrodes comprised in first IDT 802 and fourth IDT 804, respectively, by wiring electrode 807. By this configuration, second IDT 803 can carry out an operation which is equivalent to that of SAW resonators of a parallel arm.

First IDT 802, second IDT 803 and fourth IDT 804 are arranged in proximity to one another on the same propagation path of surface acoustic waves which are excited by each of the resonators. It is configured in such a manner that, surface acoustic waves which are excited by each of the SAW resonators are not negated by each other. On this account, it is desirable to make them in reversed phases. Reflector electrodes 808 are arranged on an opposite side to adjacent sides of first IDT 802, second IDT 803 and fourth IDT 804.

Electrode finger pitches are set up in such a manner that electrode finger pitches of first IDT 802 and fourth IDT 804 are smaller than an electrode finger pitch of second IDT 803 and a filter characteristic based on a design value can be obtained. An electrode finger pitch of reflector electrode 808 is set up so as to become an intermediate value of electrode finger pitches of first IDT 802 and fourth IDT 804, and an electrode finger pitch of second IDT 803.

By adopting the above-mentioned configuration, first IDT 802, second IDT 803 and fourth IDT 804 in the SAW filter of this embodiment are arranged in proximity to one another, and surface acoustic waves are contained on the same propagation path, and therefore, respective SAW resonators become equivalent to a filter with a longer resonator length. As a consequence, it is possible to realize a SAW filter which improves a characteristic of SAW resonators and which has a band pass type and a small loss characteristic. To the degree that first IDT 802, second IDT 803 and fourth IDT 804 are arranged in proximity to one another and a wiring electrode line length for connection can be reduced, it is possible to realize miniaturization of a SAW filter. As to such a SAW filter in this case, a T type configuration is a basic configuration unit.

As explained above, a SAW filter of the present invention can realize a small size and a small loss characteristic, by arranging a plurality of SAW resonators in proximity to one another on the same propagation path.

Even in this embodiment, it is possible to realize a small size SAW filter over improving a filter characteristic, by disposing a gradation area and adopting an apodization or thinned-out electrode configuration, etc., as explained in the first embodiment. In this embodiment, reflector electrode are utilized, but it is all right even if reflector electrodes are not utilized in particular, by use of such a configuration that it is possible to contain surface acoustic waves in IDTs sufficiently.

It is also all right even if several pieces of strip line electrodes are disposed between first IDT 802, second IDT 803 and fourth IDT 804. It is preferable to set up an electrode finger pitch of these strip line electrodes to an intermediate value between an electrode finger pitch of second IDT 803 and electrode finger pitches of first IDT 802 and fourth IDT 804.

It is all right even if dummy electrodes are arranged on first IDT 802, second IDT 803 and fourth IDT 804, respectively. By optimizing dummy electrodes based upon a design value, it is possible to reduce a loss much more.

In this embodiment, three IDTs are arranged on the same propagation path, but it is all right even if there are four or more. Also with regard to connection and arrangement, it is all right even if a plurality of IDTs are arranged in proximity to one another.

In this embodiment, a SAW filter of one stage configuration was explained, but it is all right even if this one stage configuration SAW filter is used as a basic SAW element and they are cascade-connected in multiple stages to realize a SAW filter of a multiple stage configuration. It is also all right even if it is not limited to a T-type configuration, but it is combined with an L type configuration, a π type configuration or another configuration such as a one terminal pair surface acoustic wave resonator element.

INDUSTRIAL APPLICABILITY

A SAW filter, which relates to the present invention, is a filter with a high attenuation characteristic requiring a lot of SAW resonators, and has such an advantage that it is possible to reduce a chip size and reduce an insertion loss at the same time, and useful for a filter in a communication field, such as portable telephones, or in a video field, such as televisions, and so on.

LIST OF REFERENCE NUMERALS AND SIGNS OF DRAWINGS

201,650,701,801,901,1001,1101 PIEZOELECTRIC SUBSTRATE
202,404,502,512,522,532,702,802,2021,2022 FIRST IDT
203,405,503,513,523,703,803,2031,2032 SECOND IDT
204,620,705,805 ONE TERMINAL
205,630,706,806 OTHER TERMINAL
206,540,541,542,707,708,807 WIRING ELECTRODE
207,301,504,505,506,514,515,516,524,525,526,534,535, 709,808,2071,2072 REFLECTOR ELECTRODE
401,402 DUMMY ELECTRODE
501 FIRST SAW ELEMENT
502 SECOND SAW ELEMENT
600,610,902,903,1002,1003,1005,1006,1102,1103,1104 SAW RESONATOR
640,904 SIGNAL LINE
704 THIRD IDT
804 FOURTH IDT
1004,1007 SLIT PLATE
2025,2035 EQUAL PITCH AREA
2026,2036 GRADATION AREA

The invention claimed is:

1. A SAW filter comprising:
   a piezoelectric substrate;
   a first inter-digital transducer having a first comb-shaped electrode with electrode fingers, disposed along a surface acoustic wave propagation path on said piezoelectric substrate, said first inter-digital transducer having a resonance frequency and being connected serially in a signal path;
   a second inter-digital transducer having a second comb-shaped electrode with electrode fingers, disposed in proximity to said first inter-digital transducer and along the surface acoustic wave propagation path, said second inter-digital transducer being connected between the signal path and a ground, having a resonance frequency different from said resonance frequency of said first inter-digital transducer;
   a first reflector electrode disposed on an outermost side of said first inter-digital transducer;
   a second reflector electrode disposed on an outermost side of said second inter-digital transducer; and
   a strip line electrode disposed between said first inter-digital transducer and said second inter-digital transducer so that said electrode fingers of said first inter-digital transducer, said strip line electrode, and said electrode fingers of said second inter-digital transducer are arranged almost continuously;
   wherein an electrode finger of said electrode fingers of said first inter-digital transducer that is the closest to said second inter-digital transducer and an electrode finger of said electrode fingers of said second inter-digital transducer that is the closest to said first inter-digital transducer determine peaks and troughs of surface acoustic waves along said surface acoustic surface wave propagation path,
   wherein said first comb-shaped electrode and said second comb-shaped electrode are connected,
   wherein a polarity of said first inter-digital transducer and a polarity of said second inter-digital transducer fall in reversed phases from each other relative to surface acoustic waves along said surface acoustic wave propagation path, and
   wherein a pitch of said electrode fingers of said strip line electrode is between a pitch of said electrode fingers of said first inter-digital transducer and a pitch of said electrode fingers of said second inter-digital transducer.

2. The SAW filter of claim 1,
   wherein said resonance frequency of said first inter-digital transducer and said resonance frequency of said second inter-digital transducer are set so as to obtain a preset filter characteristic.

3. The SAW filter of claim 2,
wherein said resonance frequency of said the first inter-digital transducer is nearly matched with an anti-resonance frequency of said second inter-digital transducer.

4. The SAW filter of claim 1,
wherein at least one of said first inter-digital transducer and said second inter-digital transducer includes one or more dummy electrodes.

5. The SAW filter of claim 1, further comprising
a third inter-digital transducer, connected between the signal path and a ground, arranged in proximity to said first inter-digital transducer and on a side of said first inter-digital transducer opposite to said second inter-digital transducer.

6. The SAW filter of claim 5,
wherein a resonance frequency of said third inter-digital transducer is different from said resonance frequency of said first inter-digital transducer.

7. The SAW filter of claim 1, further comprising
a fourth inter-digital transducer, connected serially to the signal path, arranged in proximity to said second inter-digital transducer and on a side of said second inter-digital transducer opposite to said first inter-digital transducer.

8. The SAW filter of claim 7,
wherein a resonance frequency of said fourth inter-digital transducer is different from said resonance frequency of said second inter-digital transducer.

9. A SAW filter having SAW elements connected in multiple stages and using said SAW filter of claim 1 as at least one SAW element.

10. A SAW filter comprising:
a piezoelectric substrate;
a first inter-digital transduce having a first comb-shaped electrode with electrode fingers, disposed along a surface acoustic wave propagation path on said piezoelectric substrate, said first inter-digital transducer having a resonant frequency and being connected serially in a signal path;
a second inter-digital transducer having a second comb-shaped electrode with electrode fingers, disposed in proximity to said first inter-digital transducer and along the surface acoustic wave propagation path, said second inter-digital transducer being connected between the signal path and a ground, having a resonant frequency different from said first inter-digital transducer;
a first reflector electrode disposed on an outermost side of said first inter-digital transducer;
a second reflector electrode disposed on an outermost side of said second inter-digital transducer; and
a strip line electrode disposed between said first inter-digital transducer and said second inter-digital transducer so that said electrode fingers of said first inter-digital transducer, said strip line electrode, and said electrode fingers of said second inter-digital transducer are arranged almost continuously;
wherein a pitch of electrode fingers in a boundary area of said first inter-digital transducer is different from a pitch of electrode fingers in a center area of said first inter-digital transducer,
wherein a pitch of electrode fingers in a boundary area of said second inter-digital transducer is different from a pitch of electrode fingers in a center area of said second inter-digital transducer, and
wherein a pitch of said electrode fingers of said strip line electrode is between a pitch of said electrode fingers of said first inter-digital transducer and a pitch of said electrode fingers of said second inter-digital transducer.

11. The SAW filter of claim 10,
wherein weighting is applied to at least one of said first inter-digital transducer and said second inter-digital transducer.

12. The SAW filter of claim 11,
wherein said weighting is applied using an apodized weighting method.

13. The SAW filter of claim 11,
wherein a withdrawal weighting method is applied to at least one of said first inter-digital transducer and said second inter-digital transducer.

14. The SAW filter of claim 10,
wherein at least one of said first inter-digital transducer and said second inter-digital transducer includes one or more dummy electrodes.

15. The SAW filter of claim 10, further comprising
a third inter-digital transducer, connected between the signal path and a ground, arranged in proximity to said first inter-digital transducer and on a side of said first inter-digital transducer opposite said second inter-digital transducer.

16. The SAW filter of claim 15,
wherein a resonance frequency of said third inter-digital transducer is different from said resonance frequency of said first inter-digital transducer.

17. The SAW filter of claim 10, further comprising
a fourth inter-digital transducer, connected serially to the signal path, arranged in proximity to said second inter-digital transducer and on a side of said second inter-digital transducer opposite said first inter-digital transducer.

18. The SAW filter of claim 17,
wherein a resonance frequency of said fourth inter-digital transducer is different from said resonance frequency of said second inter-digital transducer.

19. A SAW filter having SAW elements connected in multiple stages and using said SAW filter of claim 10 as at least one SAW element.

* * * * *

UNITED STATES PATENT AND TRADEMARK OFFICE
CERTIFICATE OF CORRECTION

| | | |
|---|---|---|
| PATENT NO. | : 7,501,917 B2 | Page 1 of 1 |
| APPLICATION NO. | : 10/577141 | |
| DATED | : March 10, 2009 | |
| INVENTOR(S) | : Kazunori Nishimura et al. | |

It is certified that error appears in the above-identified patent and that said Letters Patent is hereby corrected as shown below:

In column 17, claim 10, line 34, "transduce" should read --transducer--.

Signed and Sealed this

Twenty-eighth Day of July, 2009

JOHN DOLL
*Acting Director of the United States Patent and Trademark Office*